United States Patent
Katsumata et al.

(10) Patent No.: US 7,927,926 B2
(45) Date of Patent: Apr. 19, 2011

(54) NON-VOLATILE SEMICONDUCTOR STORAGE DEVICE AND METHOD OF MANUFACTURING THE SAME

(75) Inventors: Ryota Katsumata, Yokohama (JP); Masaru Kito, Yokohama (JP); Hiroyasu Tanaka, Minato-ku (JP); Masaru Kidoh, Komae (JP); Yoshiaki Fukuzumi, Yokohama (JP); Hideaki Aochi, Kawasaki (JP); Yasuyuki Matsuoka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/908,546

(22) Filed: Oct. 20, 2010

(65) Prior Publication Data
US 2011/0033995 A1 Feb. 10, 2011

Related U.S. Application Data

(62) Division of application No. 12/403,919, filed on Mar. 13, 2009, now Pat. No. 7,847,334.

(30) Foreign Application Priority Data

Mar. 14, 2008 (JP) ................................ 2008-065882

(51) Int. Cl.
*H01L 21/82* (2006.01)
(52) U.S. Cl. .... 438/129; 257/314; 257/329; 365/185.17
(58) Field of Classification Search .................. 257/315, 257/204, 316, 324; 365/185.17; 438/129
See application file for complete search history.

(56) References Cited

U.S. PATENT DOCUMENTS

| | | | |
|---|---|---|---|
| 6,727,544 B2 | 4/2004 | Endoh et al. | |
| 6,870,215 B2 | 3/2005 | Endoh et al. | |
| 6,933,556 B2* | 8/2005 | Endoh et al. | 257/315 |
| 2008/0073635 A1* | 3/2008 | Kiyotoshi et al. | 257/2 |
| 2008/0239818 A1* | 10/2008 | Mokhlesi et al. | 365/185.17 |

FOREIGN PATENT DOCUMENTS

| | | |
|---|---|---|
| JP | 11-126820 | 5/1999 |
| JP | 2001-110745 | 4/2001 |
| JP | 2002-246465 | 8/2002 |
| JP | 2003-007868 | 1/2003 |
| JP | 2007-266143 | 11/2007 |
| JP | 2008-192857 | 8/2008 |
| JP | 2008-258458 | 10/2008 |

OTHER PUBLICATIONS

Office Action issued Aug. 10, 2010, in Japanese Patent Application No. 2008-065882 (with English-language Translation).
Office Action issued Nov. 9, 2010 in JP Application No. 2008-065882 (With English Translation).
Office Action Distpatch Nov. 10, 2010, in Korea Patent Application No. 10-2009-21543 (with English translation).

* cited by examiner

*Primary Examiner* — Thanh V Pham
*Assistant Examiner* — Errol Fernandes
(74) *Attorney, Agent, or Firm* — Oblon, Spivak, McClelland, Maier & Neustadt, L.L.P.

(57) ABSTRACT

A non-volatile semiconductor storage device has a plurality of memory strings with a plurality of electrically rewritable memory cells connected in series. Each of the memory strings comprises: a first columnar semiconductor layer extending in a vertical direction to a substrate; a charge accumulation layer formed around the first columnar semiconductor layer via a first insulation layer; and a first conductive layer formed around the charge accumulation layer via a second insulation layer. Each of the first conductive layers is formed to expand in a two-dimensional manner, and air gaps are formed between the first conductive layers located there above and there below.

11 Claims, 22 Drawing Sheets

NON-VOLATILE SEMICONDUCTOR STORAGE DEVICE AND METHOD OF MANUFACTURING THE SAME

CROSS-REFERENCE TO RELATED APPLICATIONS

This application is a divisional of U.S. application Ser. No. 12/403,919 filed Mar. 13, 2009, and is based upon and claims the benefit of priority from the prior Japanese Patent Application No. 2008-65882, filed on Mar. 14, 2008, the entire contents of each of which are incorporated herein by reference.

BACKGROUND OF THE INVENTION

1. Field of the Invention

The present invention relates to electrically rewritable semiconductor storage devices, and in particular, among these, to a non-volatile semiconductor storage device and a method of manufacturing the same.

2. Description of the Related Art

Conventionally, LSIs are formed by integration of devices in a two-dimensional plane on the silicon substrate. Although the dimension for each device must be reduced (refinement) to increase memory storage capacity, recent years are facing challenges in such refinement from the viewpoint of cost and technology. Such refinement requires further improvements in photolithography technology. However, in currently available ArF immersion lithography technology, for example, the resolution limit has been reached around the 40 nm design rule and so EUV exposure devices have to be introduced for further refinement. However, the EUV exposure devices are expensive and infeasible in view of the costs. In addition, if such refinement is accomplished, it is assumed that physical improvement limit, such as in breakdown voltage between devices, would be reached unless driving voltage can be scaled. Thus, it is likely that difficulties would be encountered in device operation itself.

Therefore, a large number of semiconductor storage devices have been proposed recently where memory cells are arranged in a three-dimensional manner to achieve improved integration of memory devices (see, Patent Document 1: Japanese Patent Laid-Open No. 2003-078044; Patent Document 2: U.S. Pat. No. 5,599,724; and Patent Document 3: U.S. Pat. No. 5,707,885).

One of the conventional semiconductor storage devices where memory cells are arranged in a three-dimensional manner uses transistors with an SGT (cylinder-type) structure (see, Patent Documents 1-3). Those semiconductor storage devices using transistors with the SGT structure are provided with multiple layers of polysilicon corresponding to gate electrode layers and pillar-like columnar semiconductors formed to penetrate the multiple layers of polysilicon. Each of the columnar semiconductors serves as a channel (body) part of each of the transistors. Charge accumulation layers are provided for accumulating charges around the columnar semiconductors via barrier insulation layers. In addition, block insulation layers are formed around the charge accumulation layers. Further, word-line conductive layers, which function as gate electrodes and expand in a two-dimensional manner, are formed around the block insulation layers. Such a configuration including polysilicon, columnar semiconductors, barrier insulation layers, charge accumulation layers, block insulation layers, and word-line conductive layers is referred to as a "memory string".

This configuration, however, poses problems of larger parasitic capacitance involved between the word-line conductive layers because the word-line conductive layers are oppositely arranged to each other. In addition, if the word-line conductive layers are made thinner to ease the processing or to increase the number of laminated layers, then other problems arise in connection with an increase in resistance caused in the word-line conductive layers.

Due to the increase in parasitic capacitance and resistance in the word-line conductive layers caused by the foregoing problems, for example, when increasing the potential of the word-line conductive layers, a predetermined time difference for boosting voltage will exist between one ends of the word-line conductive layers to which voltage is applied from the plugs and the other ends spaced by a predetermined distance from the one ends. That is, a delay will be incurred in operation of the non-volatile semiconductor storage devices.

SUMMARY OF THE INVENTION

One aspect of the present invention provides a non-volatile semiconductor storage device comprising a plurality of memory strings with a plurality of electrically rewritable memory cells connected in series, each of the memory strings comprising: a first columnar semiconductor layer extending in a vertical direction to a substrate; a charge accumulation layer formed around the first columnar semiconductor layer via a first insulation layer; and a first conductive layer formed around the charge accumulation layer via a second insulation layer, each of the first conductive layers being formed to expand in a two-dimensional manner, and air gaps being formed between the first conductive layers located there above and there below.

In addition, another aspect of the present invention provides a method of manufacturing a non-volatile semiconductor storage device having a plurality of memory strings with a plurality of electrically rewritable memory cells connected in series; the method comprising: alternately laminating a plurality of sacrifice layers and a plurality of first conductive layers; forming a first hole so as to penetrate the sacrifice layers and the first conductive layers; sequentially forming a first insulation layer, a second insulation layer, a charge accumulation layer, and a first columnar semiconductor layer on the surface of the first hole; and removing the sacrifice layers.

DETAILED DESCRIPTION OF THE EMBODIMENTS

One embodiment of a non-volatile semiconductor storage device according to the present invention will now be described below with reference to the accompanying drawings.

(Configuration of Non-Volatile Semiconductor Storage Device 100 in One Embodiment)

Figure 1:
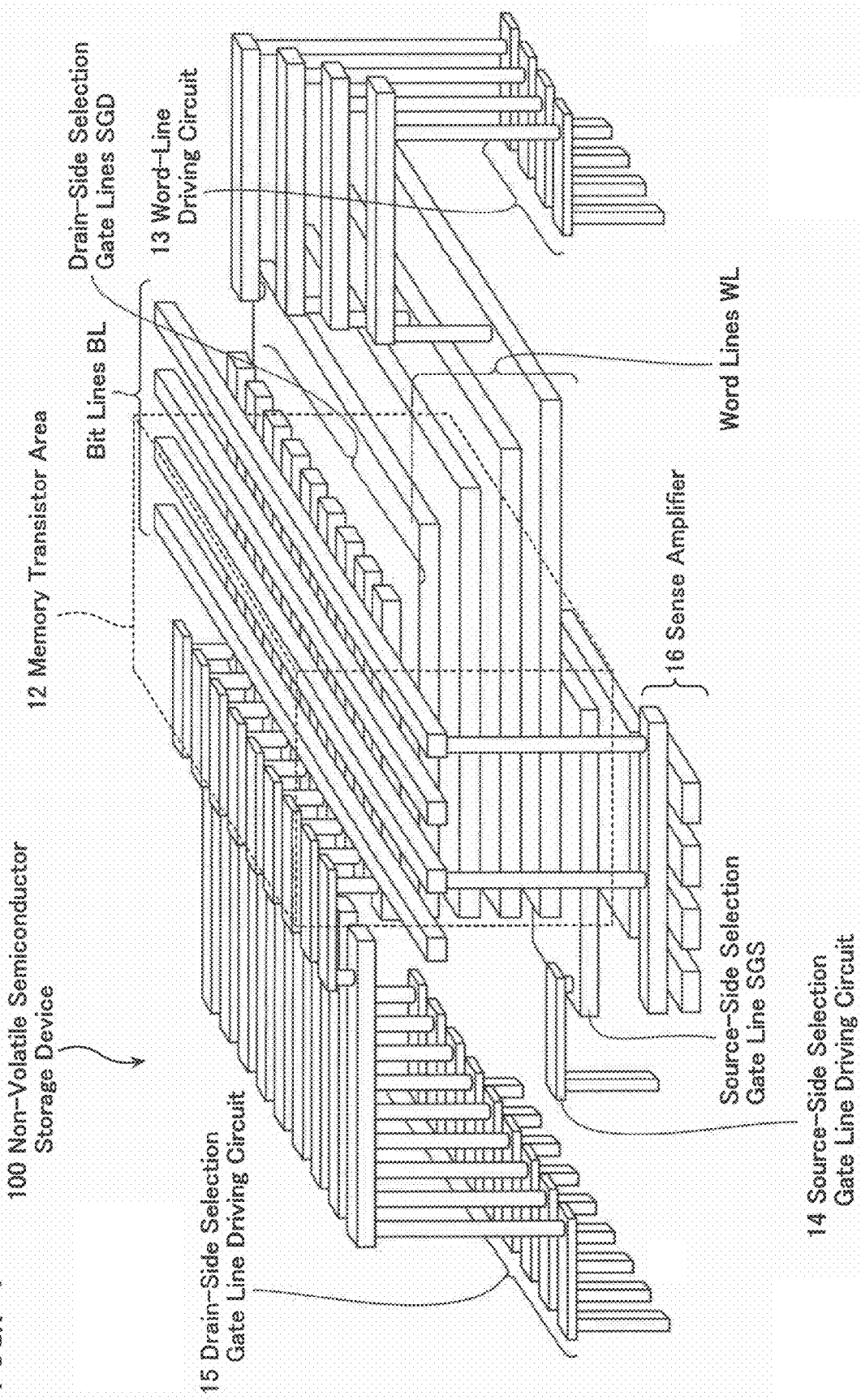
FIG. 1 is a schematic diagram illustrating a configuration of a non-volatile semiconductor storage device according to one embodiment of the present invention.

FIG. 1 schematically illustrates a non-volatile semiconductor storage device 100 according to one embodiment of the present invention. As illustrated in FIG. 1, the non-volatile semiconductor storage device 100 according to the one embodiment mainly comprises: a memory transistor area 12; a word-line driving circuit 13; a source-side selection gate line (SGS) driving circuit 14; a drain-side selection gate line (SGD) driving circuit 15; and a sense amplifier 16. The memory transistor area 12 has memory transistors for storing data. The word-line driving circuit 13 controls voltage applied to word lines WL. The source-side selection gate line (SGS) driving circuit 14 controls voltage applied to the source-side selection gate line SGS. The drain-side selection gate line (SGD) driving circuit 15 controls voltage applied to drain-side selection gate lines SGD. The sense amplifier 16 amplifies a potential read from a memory transistor. In addition to this, the non-volatile semiconductor storage device 100 according to the one embodiment comprises a bit-line driving circuit for controlling voltage applied to bit lines BL and a source-line driving circuit for controlling voltage applied to source lines SL (not illustrated).

In addition, as illustrated in FIG. 1, in the non-volatile semiconductor storage device 100 according to the one embodiment, the memory transistors that configure the memory transistor area 12 are formed by lamination of a plurality of semiconductor layers. In addition, as illustrated in FIG. 1, a word line WL of each layer expands in a two-dimensional manner in a certain area. The word line WL of each layer has a planar structure of the same layer, respectively, providing a planar plate-like structure.

Figure 2:
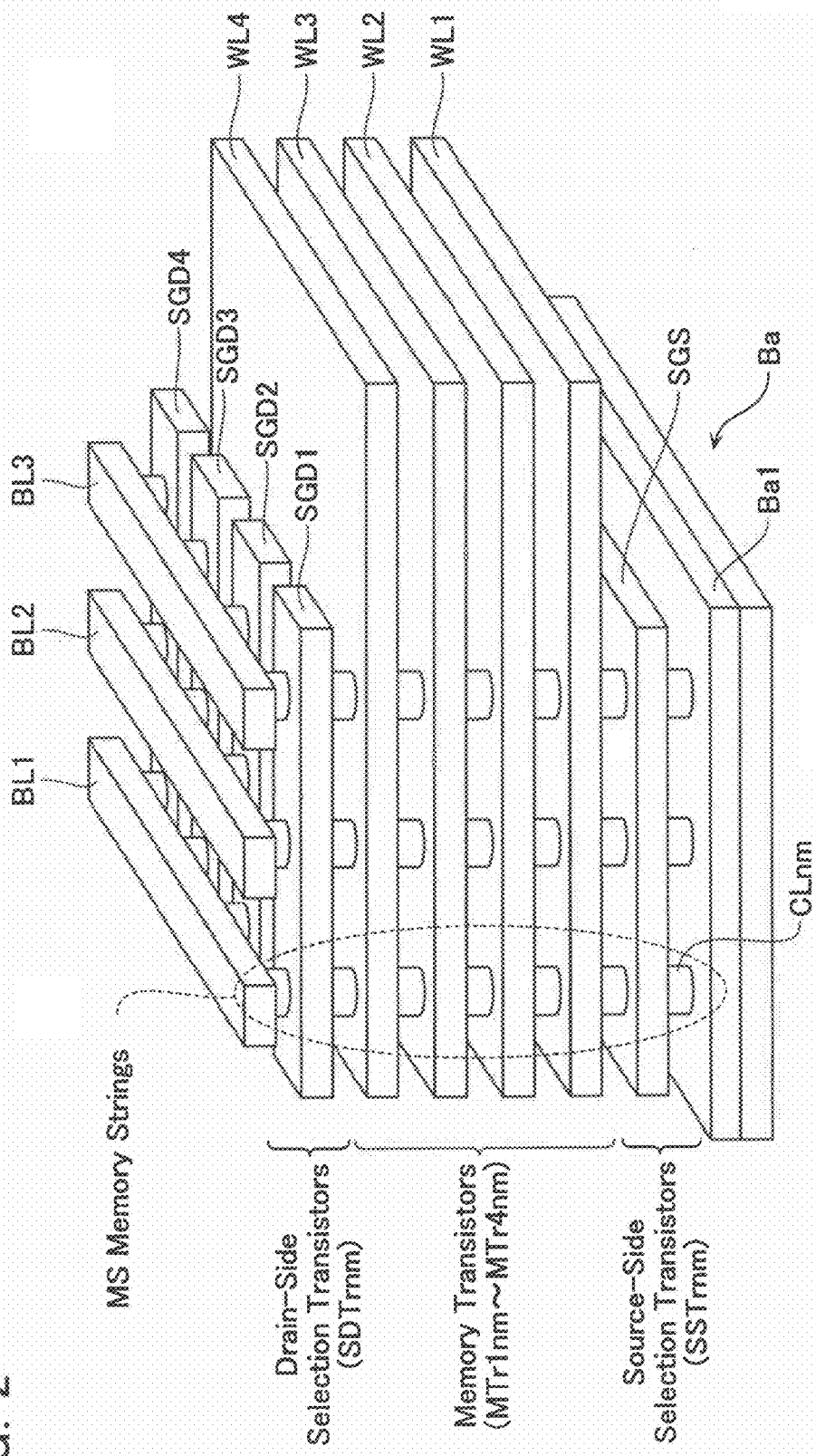
FIG. 2 is a perspective view schematically illustrating a part of the memory transistor area 12 in the non-volatile semiconductor storage device according to the one embodiment of the present invention.

FIG. 2 is a schematic configuration diagram illustrating a part of the memory transistor area 12 in the non-volatile semiconductor storage device 100 according to the one embodiment. According to the one embodiment, the memory transistor area 12 has m×n (m, n=natural number) memory strings MS including memory transistors (MTr1$mn$ to MTr4$mn$) as well as a source-side selection transistor SSTrmn and drain-side selection transistors SDTrmn. In FIG. 2, given that m=3, n=4.

In each of the memory strings MS, each of word lines (WL1 to WL4) connected to the gate of each of the memory transistors (MTr1$mn$ to MTr4$mn$) is formed by the same conductive layer and used in common therein. That is, in each of the memory strings MS, all gates of the memory transistor MTr1$mn$ are connected to the word line WL1. In addition, in each of the memory strings MS, all gates of the memory transistor MTr2$mn$ are connected to the word line WL2. In addition, in each of the memory strings MS, all gates of the memory transistor MTr3$mn$ are connected to the word line WL3. In addition, in each of the memory strings MS, all gates of the memory transistor MTr4mn are connected to the word line WL4. As illustrated in FIGS. 1 and 2, in the non-volatile semiconductor storage device 100 according to the one embodiment, each of the word lines WL1 to WL4 expands in a two-dimensional manner and has a planar plate-like structure. In addition, the word lines WL1 to WL4 are arranged substantially vertical to the respective memory strings MS.

Each of the memory strings MS has columnar semiconductors CLmn (in the case of FIG. 2, m=1 to 3, n=1 to 4) provided on an n' area that is formed on a P-well area Ba1 on a semiconductor substrate Ba. The columnar semiconductors CLmn are formed in a substantially vertical direction to the semiconductor substrate Ba and arranged in a matrix form on the respective surfaces of the semiconductor substrate Ba and the word lines WL1 to WL4. That is, the memory strings MS are also arranged in a matrix form within a plane vertical to the columnar semiconductors CLmn. Note that the columnar semiconductors CLmn may be columnar or prismatic in shape. In addition, the columnar semiconductors CLmn include terraced columnar semiconductors.

Further, as illustrated in FIG. 2, provided on the upper portions of the memory strings MS are drain-side selection gate lines SGD with rectangular plate shapes (in the case of FIG. 2, SGD1 to SGD4), which contact columnar semiconductors CLmn via insulating films (not illustrated) to configure respective drain-side selection transistors SDTrmn. The drain-side selection gate lines SGD are insulated and isolated from each other and, unlike the word lines WL1 to WL4, formed in a stripe pattern in a direction parallel to the semiconductor substrate Ba. In addition, columnar semiconductors CLmn are provided to penetrate the center in the width direction of the drain-side selection gate lines SGD.

Further, as illustrated in FIG. 2, provided on the lower portions of the memory strings MS is a source-side selection gate line SGS, which contacts the columnar semiconductors CLmn via an insulating film (not illustrated) to configure respective source-side selection transistors SSTrmn. As with the word lines WL1 to WL4, the source-side selection gate line SGS has a planar plate-like structure expanding in a two-dimensional manner.

Figure 3:
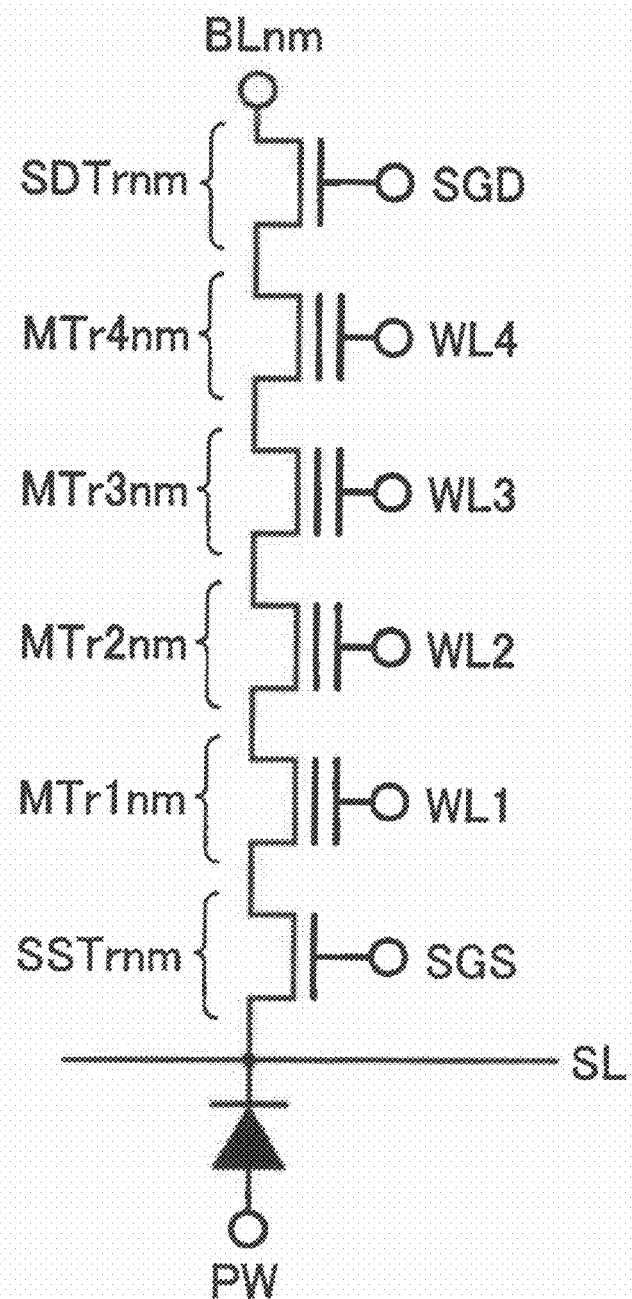
FIG. 3 is a circuit diagram illustrating one memory string MS according to the one embodiment of the present invention.

Referring now to FIGS. 2 and 3, the circuit configuration and operation of the memory strings MS of the one embodiment will be described below. FIG. 3 is a circuit diagram illustrating one memory string MS according to the one embodiment.

As illustrated in FIGS. 2 and 3, in the one embodiment, each of the memory strings MS has four memory transistors MTr1mn to MTr4mn. These four memory transistors MTr1mn to MTr4mn as well as two transistors, a source-side selection transistor SSTrmn and a drain-side selection transistor SDTrmn, are connected in series to each other (see FIG. 3). According to the one embodiment, in each of the memory strings MS, a columnar semiconductor CLmn is formed on an $n^+$ area that is formed on the $p^-$ type area (P-well area) Ba1 on the semiconductor substrate Ba.

In addition, a source line SL (an $n^+$ area formed on the P-well area Ba1 on the semiconductor substrate Ba) is connected to the source of each source-side selection transistor SSTrmn. Further, a bit line BLnm is connected to the drain of each drain-side selection transistor SDTrmn.

Each of the memory transistors MTrmn includes a columnar semiconductor CLmn, a charge accumulation layer that is surrounded by an insulation layer and formed to surround the columnar semiconductor CLmn, and a word line WL that is formed to surround the charge accumulation layer. The end of each word line WL that contacts the charge accumulation layer surrounded by the insulation film functions as a control gate of the corresponding memory transistor MTrmn. The sources and drains of the memory transistors MTrmn are formed at the columnar semiconductors CLmn.

In the non-volatile semiconductor storage device 100 with the above-mentioned configuration, respective voltages of the bit lines BL1 to BL3, the drain-side selection gate lines SGD, the word lines WL1 to WL4, the source-side selection gate line SGS, and the source lines SL are controlled by bit line driving circuits (not illustrated), the drain-side selection gate line driving circuit 15, the word line driving circuits 13, the source-side selection gate line driving circuit 14, and a source line driving circuit (not illustrated). That is, data is written and erased by controlling charges of the charge accumulation layer in a predetermined memory transistor MTrmn.

(Specific Configuration of Non-Volatile Semiconductor Storage Device 100 in One Embodiment)

Figure 4:
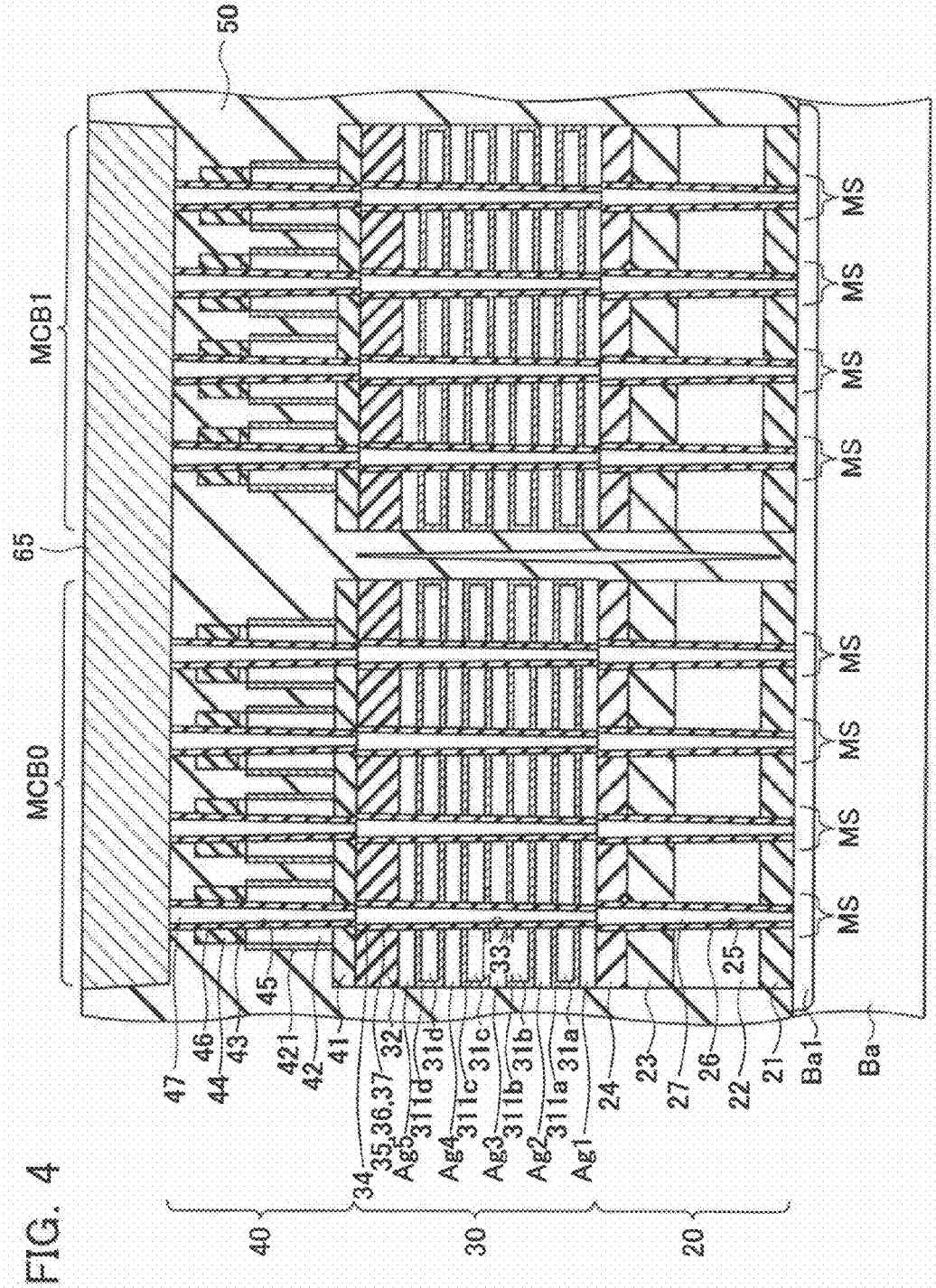
FIG. 4 illustrates a cross-sectional structure in the column direction of the non-volatile semiconductor storage device according to the one embodiment of the present invention.
Figure 5:
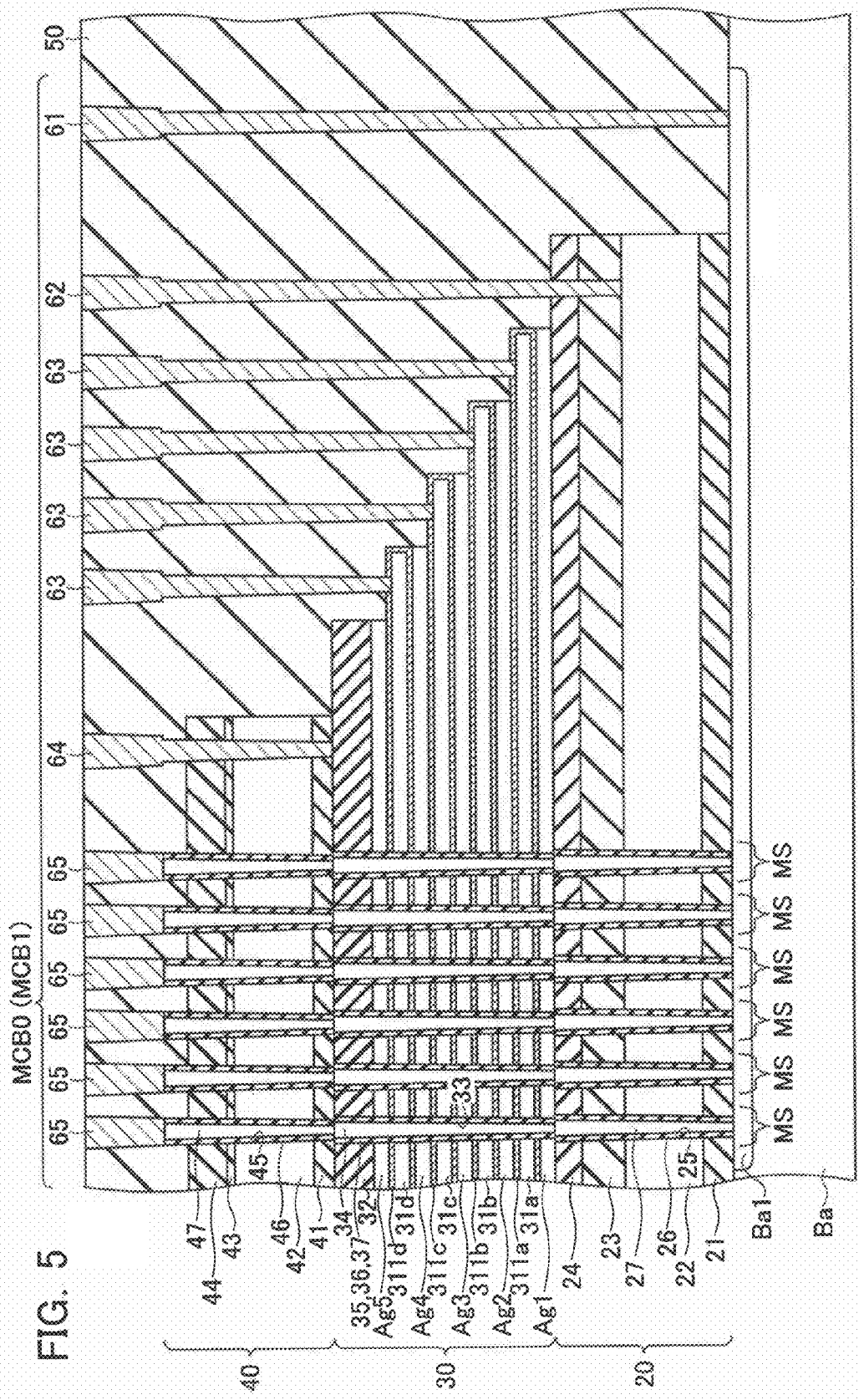
FIG. 5 illustrates a cross-sectional structure in the row direction of the non-volatile semiconductor storage device according to the one embodiment of the present invention.

Referring now to FIGS. 4 and 5, a further specific configuration of the non-volatile semiconductor storage device 100 will be described below. FIG. 4 illustrates a cross-sectional structure in the column direction; and FIG. 5 illustrated a cross-sectional structure in the row direction orthogonal to the column direction. As illustrated in FIGS. 4 and 5, the non-volatile semiconductor storage device 100 has memory cell blocks MCB0 and MCB1 on the semiconductor substrate Ba. Each of the memory cell blocks MCB0 and MCB1 has a plurality of memory strings MS. An interlayer insulation layer 50 is formed between the memory cell blocks MCB0 and MCB1.

The memory cell block MCB0 (or MCB1) has, from lower layer to upper layer, a source-side selection transistor layer 20, a memory transistor layer 30, and a drain-side selection transistor layer 40. The source-side selection transistor layer 20 functions as a source-side selection transistor SSTrmn. The memory transistor layer 30 functions as a memory transistor MTrmn. The drain-side selection transistor layer 40 functions as a drain-side selection transistor SDTrmn.

The source-side selection transistor layer 20 has a source-side first insulation layer 21, a source-side conductive layer 22, a source-side second insulation layer 23, and a source-side third insulation layer 24 that are sequentially laminated on the semiconductor substrate Ba (the P-well are Ba1). The source-side first insulation layer 21 and the source-side third insulation layer 24 are composed of, e.g., silicon oxide ($SiO_2$). In addition, the source-side conductive layer 22 is composed of, e.g., polysilicon (p-Si). In addition, the source-side second insulation layer 23 is composed of, e.g., silicon nitride (SiN). Note that one end of the source-side conductive layer 22 functions as the control gate of the source-side selection transistor SSTrmn.

The source-side selection transistor layer 20 has source-side holes 25 formed therein so as to penetrate the source-side first insulation layer 21, the source-side conductive layer 22, the source-side second insulation layer 23, and the source-side third insulation layer 24. The source-side holes 25 have source-side columnar semiconductor layers 27 provided therein via source-side gate insulation layers 26. The source-side columnar semiconductor layers 27 are formed in contact with the bottom surfaces of memory columnar semiconductor layers 34 described below and formed to extend in the vertical direction. The source-side gate insulation layers 26 are formed by HTO. The source-side columnar semiconductor layers 27 are formed by amorphous silicon. Note that HTO is oxide TEOS with high-temperature film formation. In addition, the source-side selection transistor layer 20 is formed with a predetermined length in the row direction (see FIG. 5).

The memory transistor layer 30 has plate-like first to fourth word-line conductive layers 31a to 31d expanding in a two-dimensional manner, and a memory upper insulation layer 32. The first to fourth word-line conductive layers 31a to 31d are formed by polysilicon. In addition, the memory upper insulation layer 32 is formed by silicon nitride. Note that the first to fourth word-line conductive layers 31a to 31d function as the word lines WL1 to WL4.

The first word-line conductive layer 31a is provided above the source-side third insulation layer 24 via an air gap Ag1. The second word-line conductive layer 31b is provided above the first word-line conductive layer 31a via an air gap Ag2. The third word-line conductive layer 31c is provided above the second word-line conductive layer 31b via an air gap Ag3. The fourth word-line conductive layer 31d is provided above the third word-line conductive layer 31c via an air gap Ag4. The memory upper insulation layer 32 is provided above the fourth word-line conductive layer 31d via an air gap Ag5. In addition, the first to fourth word-line conductive layers 31a to 31d are formed by polysilicon, and they have silicide films 311a to 311d on their surfaces.

Each of the air gaps Ag1 to Ag5 has provided therein an insulative fluid, such as air, with lower permittivity than silicon oxide (dielectric constant: approximately 4). As used herein, a fluid means either gas or liquid (including gel). In addition, the air gaps Ag1 to Ag5 may be partially filled with the fluid with lower permittivity than silicon oxide. The air gaps Ag1 to Ag5 may be provided with solid insulation layers with lower permittivity than silicon oxide (dielectric constant: approximately 4). The fluid with lower permittivity than silicon oxide may be composed of such material to be a solid insulation layer after heat treatment.

Silicide films 311a to 311d are configured with any of the following: titanium (Ti), cobalt (Co), nickel (Ni), etc.

As illustrated in FIG. 5, the first to fourth word-line conductive layers 31a to 31d and the memory upper insulation layer 32 are formed in a stepwise manner in relation to each other at their respective row-direction ends and the row-direction end of the source-side selection transistor layer 20. In addition, the air gaps Ag1 to Ag5 are formed over the same regions as the respective bottom surfaces of the first to fourth word-line conductive layers 31a to 31d and the memory upper insulation layer 32.

Further, the memory transistor layer 30 has memory holes 33 that are formed to penetrate the first to fourth word-line conductive layers 31a to 31d and the memory upper insulation layer 32, and memory columnar semiconductor layers 34 that are formed in the memory holes 33. The memory columnar semiconductor layers 34 are formed by amorphous silicon.

Further, the memory transistor layer 30 has barrier insulation layers 35 that contact the memory columnar semiconductor layers 34, a plurality of charge accumulation layers 36 that contact the barrier insulation layers 35 and accumulate charges, and a plurality of block insulation layers 37 that contact the charge accumulation layers 36. The block insulation layers 37 contact the first to fourth word-line conductive layers 31a to 31d. The barrier insulation layers 35 are formed by silicon oxide. The charge accumulation layers 36 are formed by silicon nitride (SiN). The block insulation layers 37 are formed by aluminum oxide ($Al_2O_3$). That is, polysilicon-aluminum-silicon nitride-silicon oxide-polysilicon structures (SANOS structures) are formed on the sidewalls of the memory holes 33.

The drain-side selection transistor layer 40 has a drain-side first insulation layer 41, drain-side conductive layers 42, drain-side second insulation layers 43, and drain-side third insulation layers 44 that are sequentially laminated on the memory upper insulation layer 32. As can be seen from the cross-sectional view in the row direction (FIG. 4), the drain-side first insulation layer 41, the drain-side conductive layers 42, the drain-side second insulation layers 43, and the drain-side third insulation layers 44 are formed above the memory columnar semiconductor layers 34 over a predetermined range.

The drain-side first insulation layer 41 and the drain-side second insulation layers 43 are formed by silicon oxide. The drain-side conductive layers 42 are formed by polysilicon. The drain-side third insulation layers 44 are formed by silicon nitride. In addition, the drain-side conductive layers 42 have silicide films 421 on their side surfaces parallel to the row direction. Note that one ends of the drain-side conductive layers function as the control gates of the drain-side selection transistors SDTmm.

In addition, the drain-side selection transistor layer 40 has drain-side holes 45 formed therein so as to penetrate the drain-side first insulation layer 41, the drain-side conductive layers 42, the drain-side second insulation layers 43, and the drain-side third insulation layers 44. The drain-side holes 45 have drain-side columnar semiconductor layers 47 provided therein via drain-side gate insulation layers 46. The drain-side columnar semiconductor layers 47 are formed in contact with the top surfaces of the memory columnar semiconductor layers 34 and formed to extend in the vertical direction. The drain-side gate insulation layers 46 are formed by HTO. The drain-side columnar semiconductor layers 47 are formed by amorphous silicon.

Further, in the memory cell blocks MCB0 and MCB1 configured as described above, a source line contact layer 61 is formed from the surface of the interlayer insulation layer 50 so that it comes in contact with the periphery of the row-direction end of the P-well area Ba1 on the semiconductor substrate Ba. In addition, a source-side selection gate contact layer 62 is formed from the surface of the interlayer insulation layer 50 so that it comes in contact with the periphery of the row-direction end of the source-side conductive layer 22. In addition, control gate contact layers 63 are formed from the surface of the interlayer insulation layer 50 so that they come in contact with the periphery of the row-direction ends of the first to fourth word-line conductive layers 31a to 31d formed in a stepwise manner in relation to each other. In addition, a drain-side selection gate contact layer 64 is formed from the surface of the interlayer insulation layer 50 so that it comes in contact with the periphery of the row-direction ends of the drain-side conductive layers 42. In addition, bit-line layers 65 are formed from the surface of the interlayer insulation layer 50 so that they come in contact with the top surfaces of the drain-side columnar semiconductor layers 47. Note that the bit-line layers 65 are formed in a linear shape in the column direction.

(Manufacturing Process of Non-Volatile Semiconductor Storage Device 100 in One Embodiment)

Referring now to FIGS. 6 to 30, an example of the manufacturing process of the non-volatile semiconductor storage device 100 according to the one embodiment will be described below.

Figure 6:
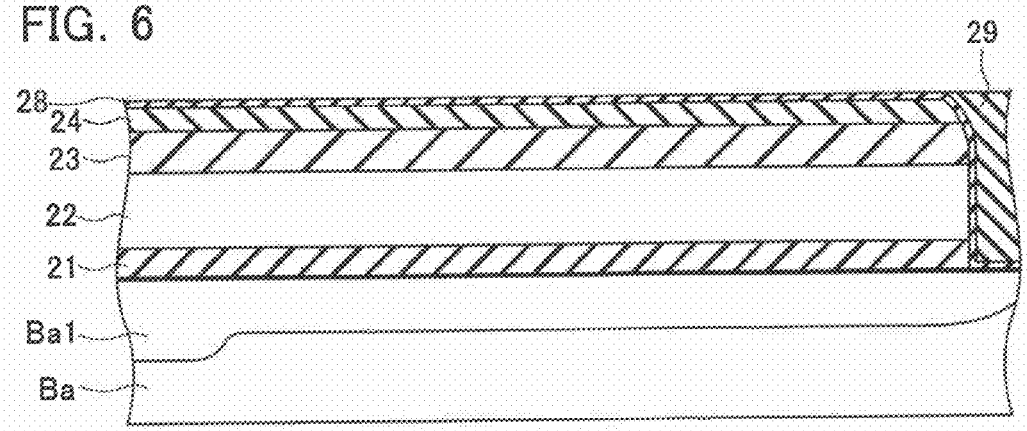
FIG. 6 is a cross-sectional view of the non-volatile semiconductor storage device 100 in a manufacturing process according to the one embodiment of the present invention.

Firstly, as illustrated in FIG. 6, a source-side selection transistor layer 20 is formed on the substrate Ba. In the case of FIG. 6, in the source-side selection transistor layer 20, a barrier insulation layer 28 of silicon nitride is formed on the source-side third insulation layer 24. In addition, a source-side interlayer insulation layer 29 is formed at the row-direction end of the source-side selection transistor layer 20. Note that flattening is performed on the respective surfaces of the source-side selection transistor layer 20 (the barrier insulation layer 28) and the source-side interlayer insulation layer 29.

Figure 7:
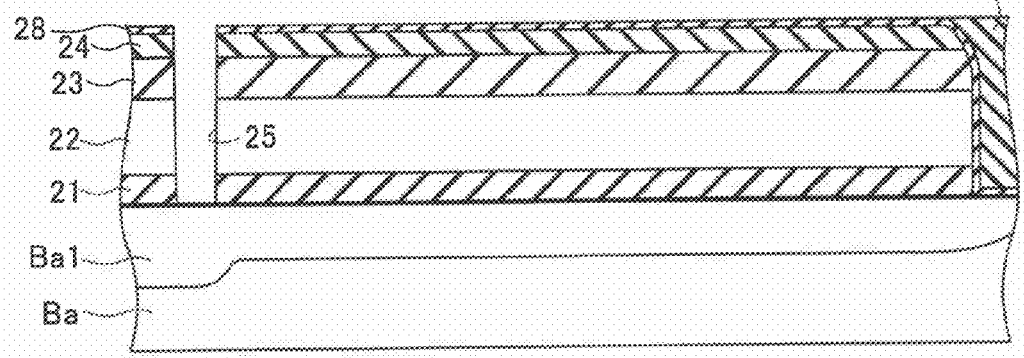
FIG. 7 is a cross-sectional view of the non-volatile semiconductor storage device 100 in the manufacturing process according to the one embodiment of the present invention.

Then, resists are applied thereto, providing hole patterns in a matrix form by lithography. Thereafter, a source-side hole 25 is formed by Reactive Ion Etching (RIE) so as to penetrate the barrier insulation layer 28, the source-side third insulation layer 24, the source-side second insulation layer 23, the source-side conductive layer 22, and the source-side first insulation layer 21. Further, phosphorus ion (P) is implanted over the source-side hole 25 under 10 keV/5 $e^{15}$. The resulting state of this process is depicted in FIG. 7.

Figure 8:
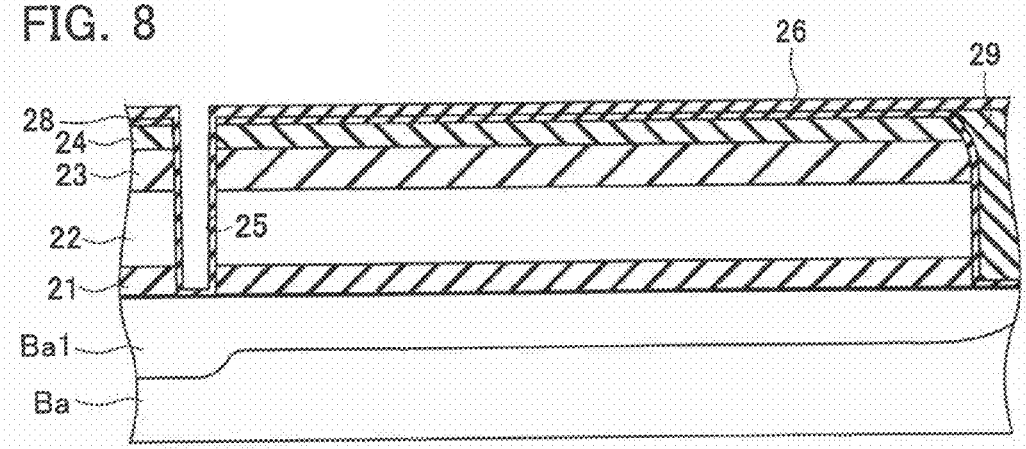
FIG. 8 is a cross-sectional view of the non-volatile semiconductor storage device 100 in the manufacturing process according to the one embodiment of the present invention.

Then, a silicon oxide film corresponding to a source-side gate insulation layer 26 is deposited by a low-pressure CVD method as illustrated in FIG. 8. The silicon oxide film (the source-side gate insulation layer 26) is deposited with a thickness of, e.g., 10 nm.

Figure 9:
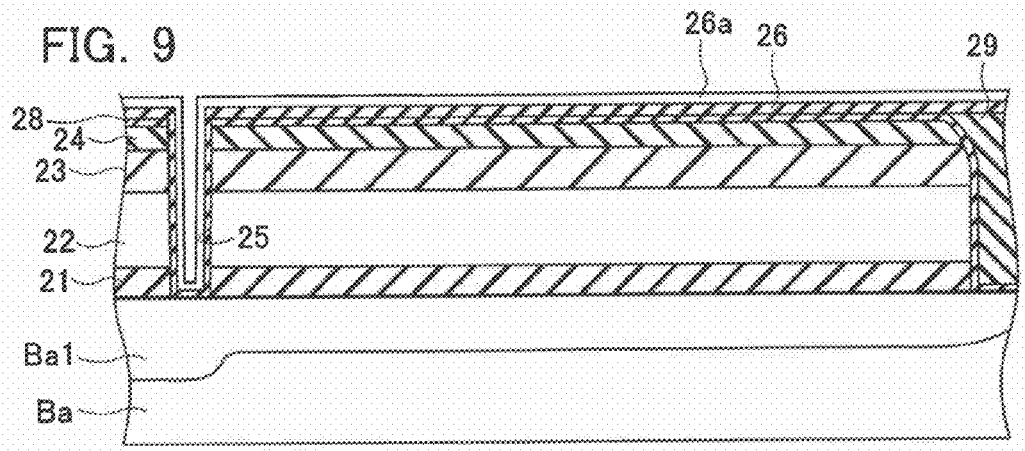
FIG. 9 is a cross-sectional view of the non-volatile semiconductor storage device 100 in the manufacturing process according to the one embodiment of the present invention.

Then, an amorphous silicon layer 26a is deposited thereon as illustrated in FIG. 9. The amorphous silicon layer 26a is deposited with a thickness of, e.g., 15 nm.

Figure 10:
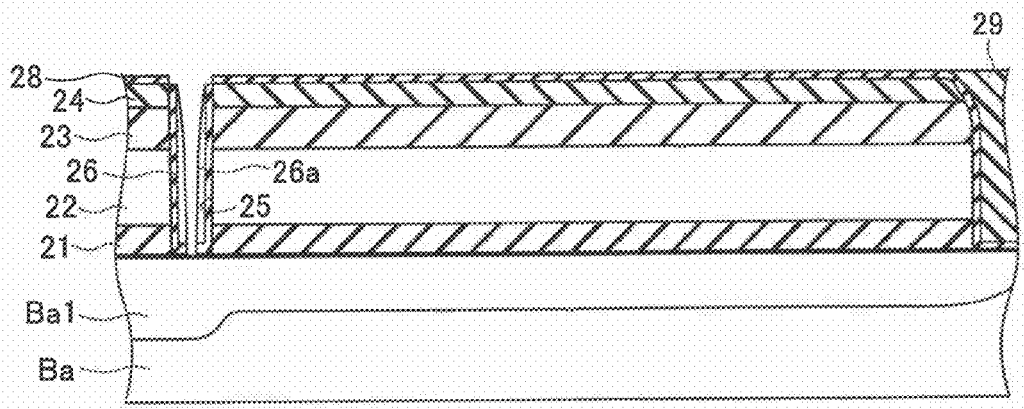
FIG. 10 is a cross-sectional view of the non-volatile semiconductor storage device 100 in the manufacturing process according to the one embodiment of the present invention.

Then, as illustrated in FIG. 10, those portions of the amorphous silicon layer 26a and the source-side gate insulation layer 26 are removed by RIE that are located on the bottom surface of the source-side hole 25 and on the top surface of the source-side third insulation layer 24, respectively. That is, the source-side gate insulation layer 26 and the amorphous silicon layer 26a are processed to be left only on the sidewall of the source-side hole 25.

Figure 11:
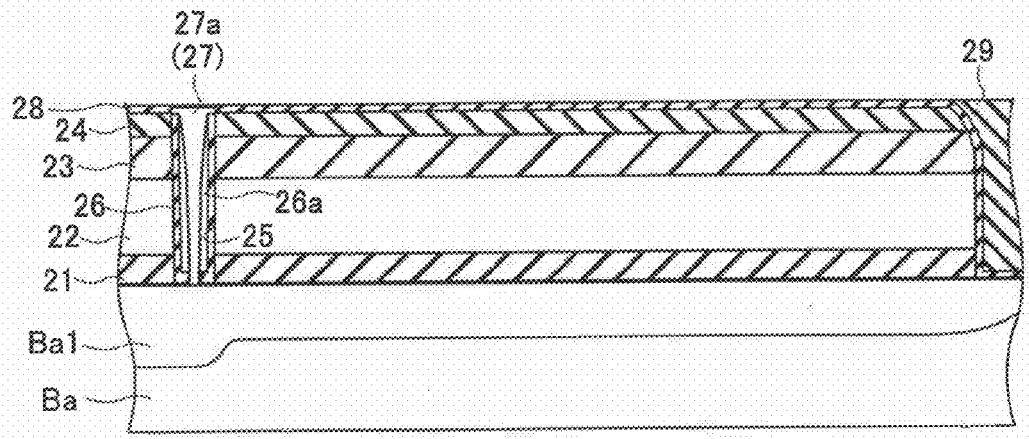
FIG. 11 is a cross-sectional view of the non-volatile semiconductor storage device 100 in the manufacturing process according to the one embodiment of the present invention.

Then, as illustrated in FIG. 11, an amorphous silicon layer 27a is deposited in the source-side hole 25, the surface of which is then flattened by Chemical Mechanical Polishing (CMP). The amorphous silicon layer 27a and the amorphous silicon layer 26a become a source-side columnar semiconductor layer 27. Then, phosphorus ion (P) is implanted into the source-side columnar semiconductor layer 27 under 220/250/280 keV/5 $e^{11}$. Then, arsenic ion (As) is implanted into the source-side columnar semiconductor layer 27 under 40 keV/5 $e^{15}$. Further, an activation process is performed with RTA (Rapid Thermal Anneal) under 960 deg C./10 sec.

Figure 12:
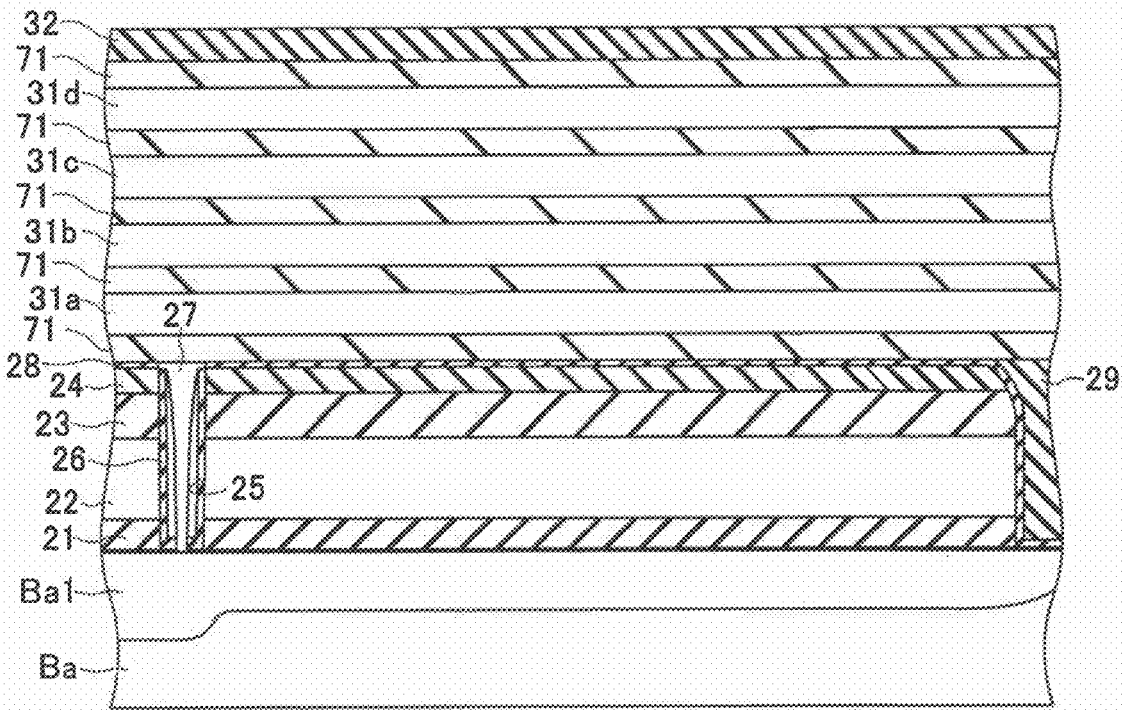
FIG. 12 is a cross-sectional view of the non-volatile semiconductor storage device 100 in the manufacturing process according to the one embodiment of the present invention.

Then, as illustrated in FIG. 12, polysilicon layers corresponding to first to fourth word-line conductive layers 31a to 31d are sequentially laminated thereon via sacrifice layers 71. Silicon nitride is further deposited on the top of the deposited sacrifice layers 71 to form a memory upper insulation layer 32. The sacrifice layers 71 are formed by such material that has a lower etching selectivity than that of the first to fourth word-line conductive layers 31a to 31d. In addition, the sacrifice layers 71 are composed of such material that can be processed by etching gas for use in silicon (Si) processing. For example, the sacrifice layers 71 are formed by material such as silicon germanium (SiGe) or silicon nitride (SiN).

Figure 13:
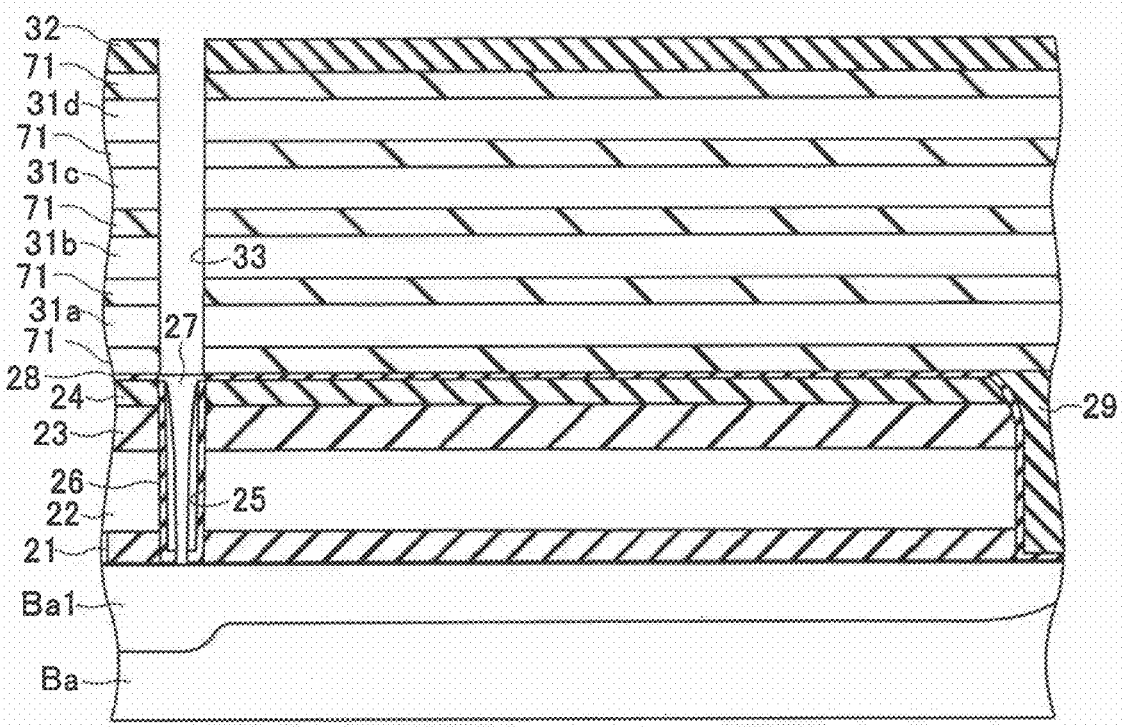
FIG. 13 is a cross-sectional view of the non-volatile semiconductor storage device 100 in the manufacturing process according to the one embodiment of the present invention.

Then, as illustrated in FIG. 13, a memory hole 33 is formed on the upper portion of the source-side hole 25, through a similar process to the source-side hole 25, so as to penetrate the sacrifice layers 71, the first to fourth word-line conductive layers 31a to 31d, and the memory upper insulation layer 32.

Figure 14:
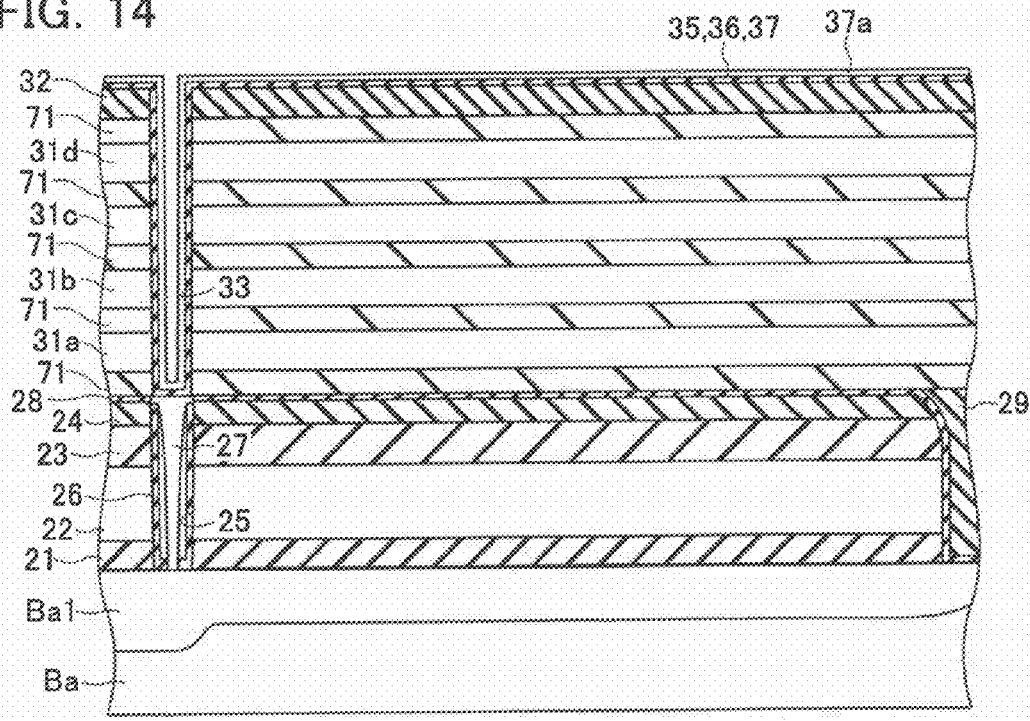
FIG. 14 is a cross-sectional view of the non-volatile semiconductor storage device 100 in the manufacturing process according to the one embodiment of the present invention.

Then, as illustrated in FIG. 14, an aluminum film, a silicon nitride film, and a silicon oxide film are sequentially deposited thereon, each corresponding to a block insulation layer 37, a charge accumulation layer 36, and a barrier insulation layer 35. Thereafter, an amorphous silicon layer 37a is deposited thereon. For example, the aluminum film corresponding to the block insulation layer 37 is formed with a thickness of 12 nm. In addition, the silicon nitride film corresponding to the charge accumulation layer 36 is formed with a thickness of, e.g., 10 nm. In addition, the silicon oxide film corresponding to the barrier insulation layer 35 is formed with a thickness of, e.g., 4 nm. In addition, the amorphous silicon layer 37a is formed with a thickness of, e.g., 10 nm.

Figure 15:
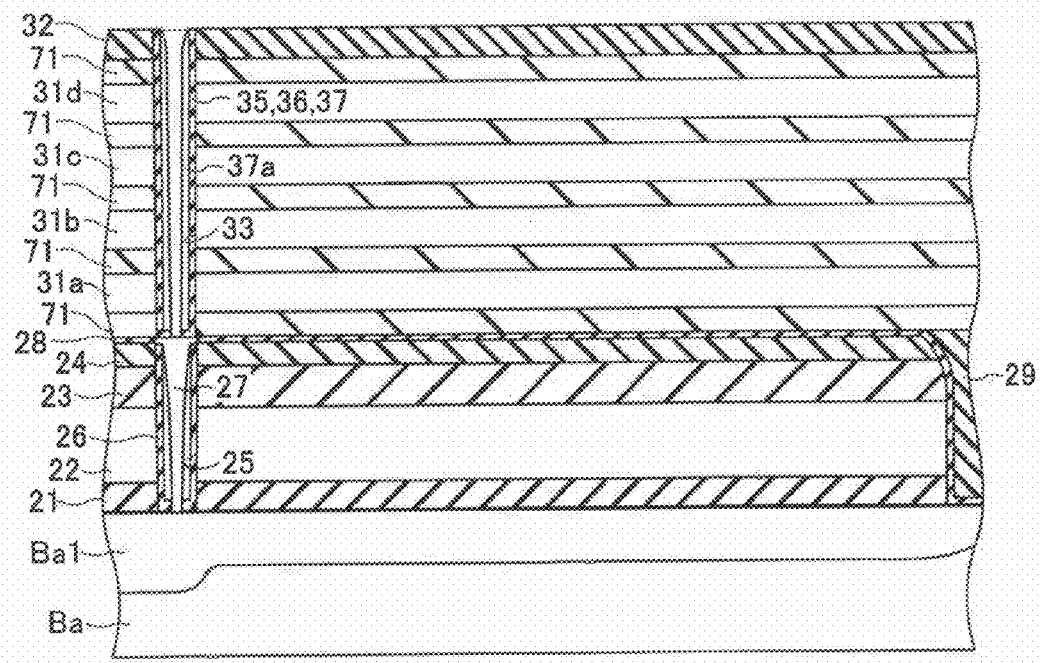
FIG. 15 is a cross-sectional view of the non-volatile semiconductor storage device 100 in the manufacturing process according to the one embodiment of the present invention.

Then, as illustrated in FIG. 15, those portions of the amorphous silicon layer 37a, the barrier insulation layer 35, the charge accumulation layer 36, and the block insulation layer 37 are removed by RIE that are located on the bottom surface of the memory hole 33 and on the top surface of the memory upper insulation layer 32, respectively. That is, the block insulation layer 37, the charge accumulation layer 36, the barrier insulation layer 35, and the amorphous silicon layer 37a are processed to be left only on the sidewall of the memory hole 33. As a result, a polysilicon-aluminum-silicon nitride-silicon oxide-polysilicon structure (SANOS structure) is formed on the sidewall of the memory hole 33. Then, using angled ion implantation, phosphorus ion (P) is implanted to the sidewall of the memory hole 33 from four directions under 5 keV/2 $e^{11}$ for each direction.

Figure 16:
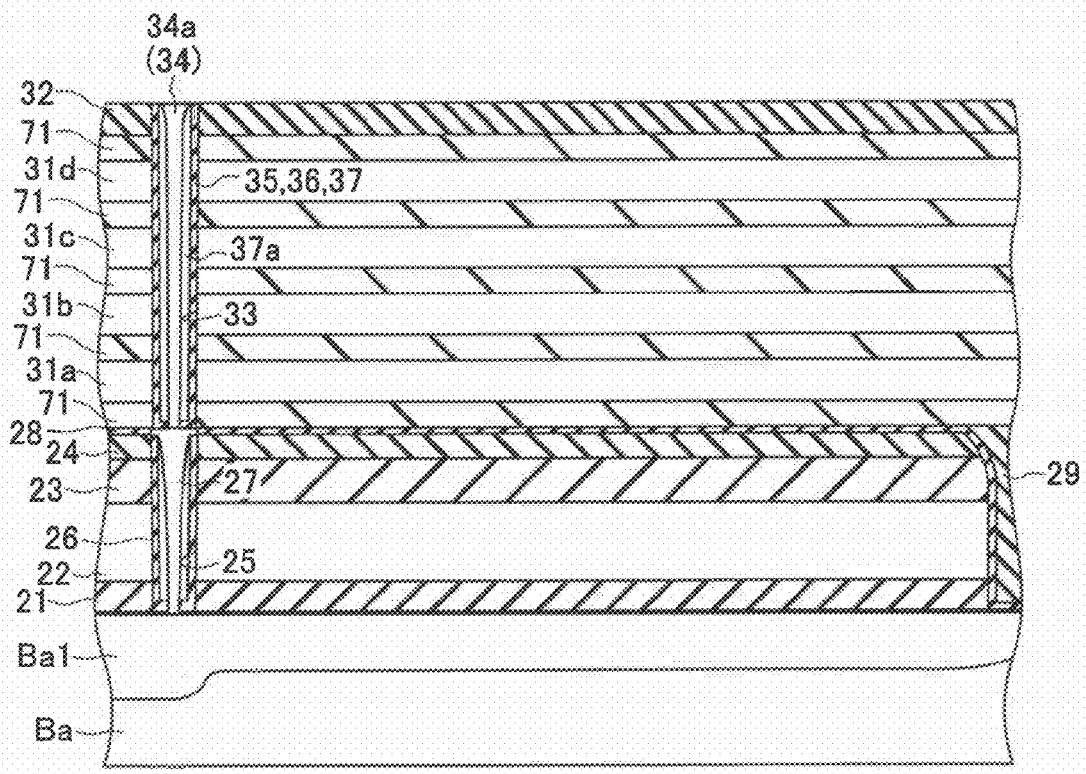
FIG. 16 is a cross-sectional view of the non-volatile semiconductor storage device 100 in the manufacturing process according to the one embodiment of the present invention.

Then, an amorphous silicon layer 47a is deposited in the memory hole 33, the surface of which is then flattened by CMP. The amorphous silicon layer 47a and the amorphous silicon layer 37a become a memory columnar semiconductor layer 34. Then, arsenic ion (As) is implanted into the memory columnar semiconductor layer 34 under 40 keV/5 $e^{15}$. Then, an activation process is performed with RTA (Rapid Thermal Anneal) under 960 deg C./10 sec. The resulting state of this process is depicted in FIG. 16.

Figure 17:
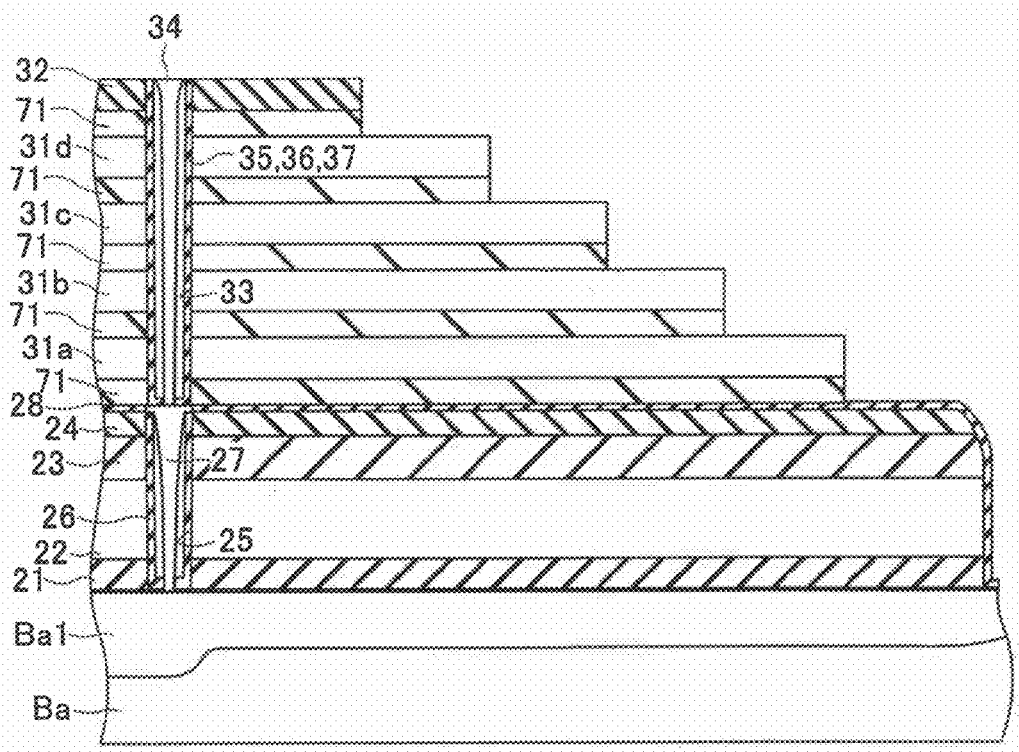
FIG. 17 is a cross-sectional view of the non-volatile semiconductor storage device 100 in the manufacturing process according to the one embodiment of the present invention.

Then, as illustrated in FIG. 17, etching is performed in such a way that the row-direction end of the source-side selection transistor layer 20, the row-direction ends of the first to fourth word-line conductive layers 31a to 31d, and the row-direction end of the memory upper insulation layer 32 are formed in a stepwise manner in relation to each other. For example, the etching is repeated multiple times in this step, while forming a resist pattern on the top surface of the memory upper insulation layer 32 and slimming down the resist pattern.

Figure 18:
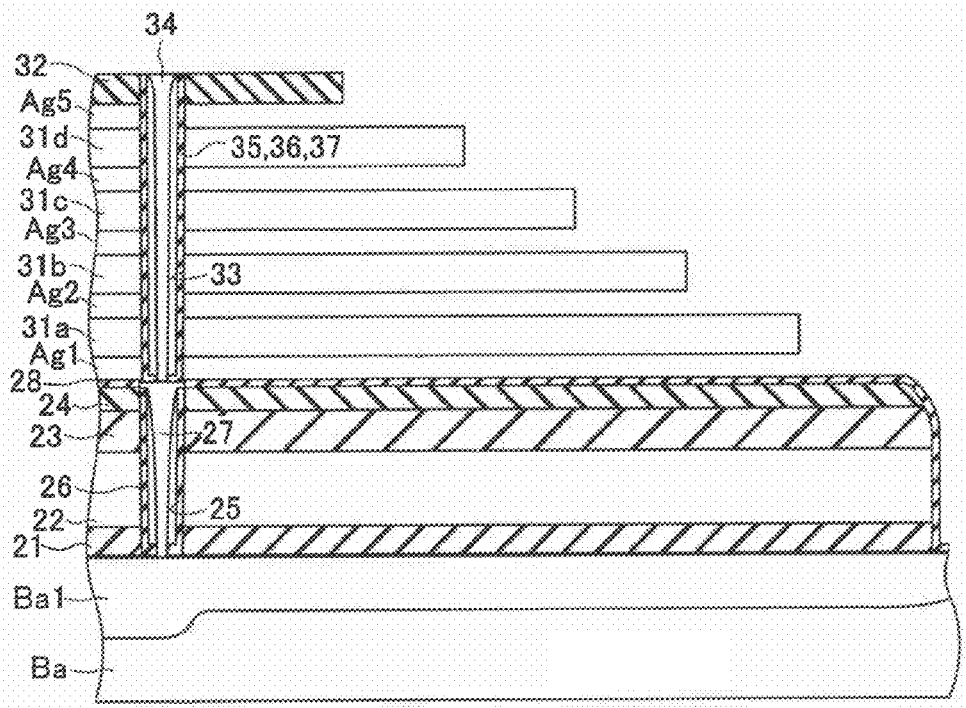
FIG. 18 is a cross-sectional view of the non-volatile semiconductor storage device 100 in the manufacturing process according to the one embodiment of the present invention.

Then, the sacrifice layers 71 are removed by etching as illustrated in FIG. 18. In this case, if the sacrifice layers 71 are formed by silicon germanium, then the etching is performed with hydrofluoric-nitric acid diluted with acetic acid. In addition, if the sacrifice layers 71 are formed by silicon nitride, then the etching is performed with Hot phosphoric acid. In addition, if the sacrifice layers 71 are composed of SOG (Spin On Glass) or other material with low permittivity, then the etching is selectively performed with diluted hydrofluoric acid treatment. Through this process, an air gap Ag1 is provided between the first word-line conductive layer 31a and the source-side third insulation layer 24. In addition, an air gap Ag2 is provided between the second word-line conductive layer 31b and the first word-line conductive layer 31a. In addition, an air gap Ag3 is provided between the third word-line conductive layer 31c and the second word-line conductive layer 31b. In addition, an air gap Ag4 is provided between the fourth word-line conductive layer 31d and the third word-line conductive layer 31c. In addition, an air gap Ag5 is provided between the memory upper insulation layer 32 and the fourth word-line conductive layer 31d. That is, this provides a structure such that the first to fourth word-line conductive layers 31a to 31d and the memory upper insulation layer 32 are supported by the memory columnar semiconductor layer 34.

Figure 19:
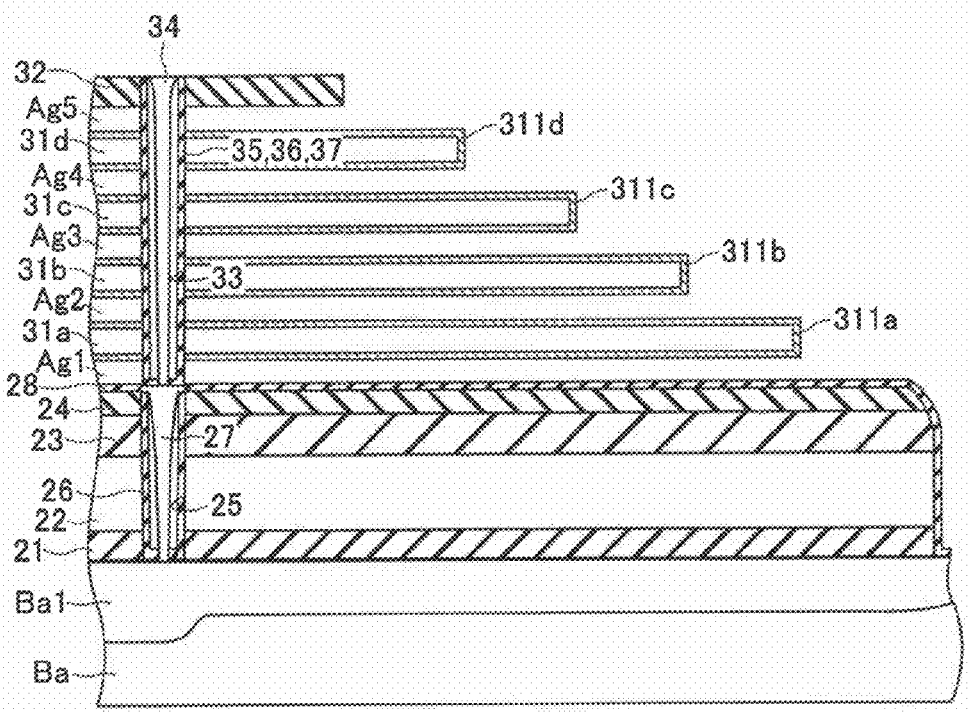
FIG. 19 is a cross-sectional view of the non-volatile semiconductor storage device 100 in the manufacturing process according to the one embodiment of the present invention.

Then, as illustrated in FIG. 19, the first to fourth word-line conductive layers 31a to 31d are silicided, and silicide films 311a to 311d are formed on the resulting surfaces. Note that this silicidation step involves deposition of a metal CVD film, e.g., a metal film based on a Ti-CVD or Ti-ALD method, and heat treatment. Note that the metal used for silicidation in the step of FIG. 19 may be cobalt (Co), nickel (Ni), etc.

Figure 20:
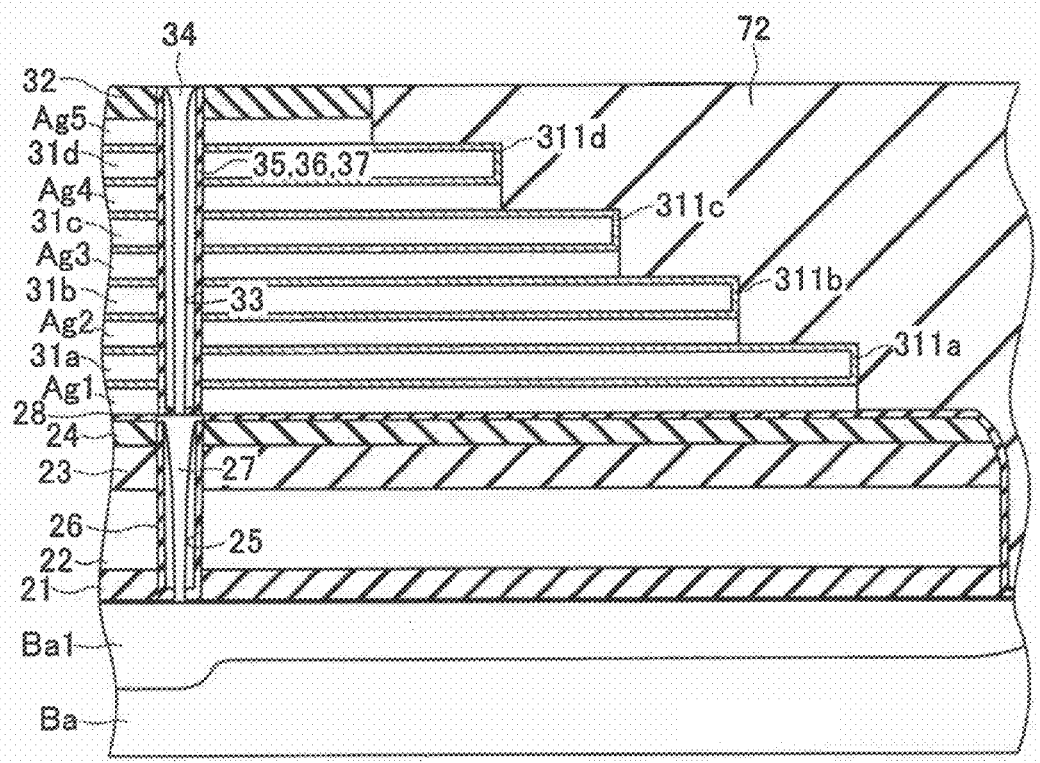
FIG. 20 is a cross-sectional view of the non-volatile semiconductor storage device 100 in the manufacturing process according to the one embodiment of the present invention.

Then, as illustrated in FIG. 20, a silicon oxide film corresponding to an interlayer insulation layer 72 is deposited thereon, the surface of which is then flattened by CMP process to be parallel to the top surface of the memory upper insulation layer 32. Note that the step of depositing the silicon oxide film is performed by a method with poor coverage, e.g., plasma CVD. In addition, in the step of FIG. 20, the air gaps Ag1 to Ag4 are filled with an insulative fluid, such as air, with lower permittivity than silicon oxide. In addition, the air gaps Ag1 to Ag4 may be partially filled with the fluid with lower permittivity than silicon oxide.

Figure 21:
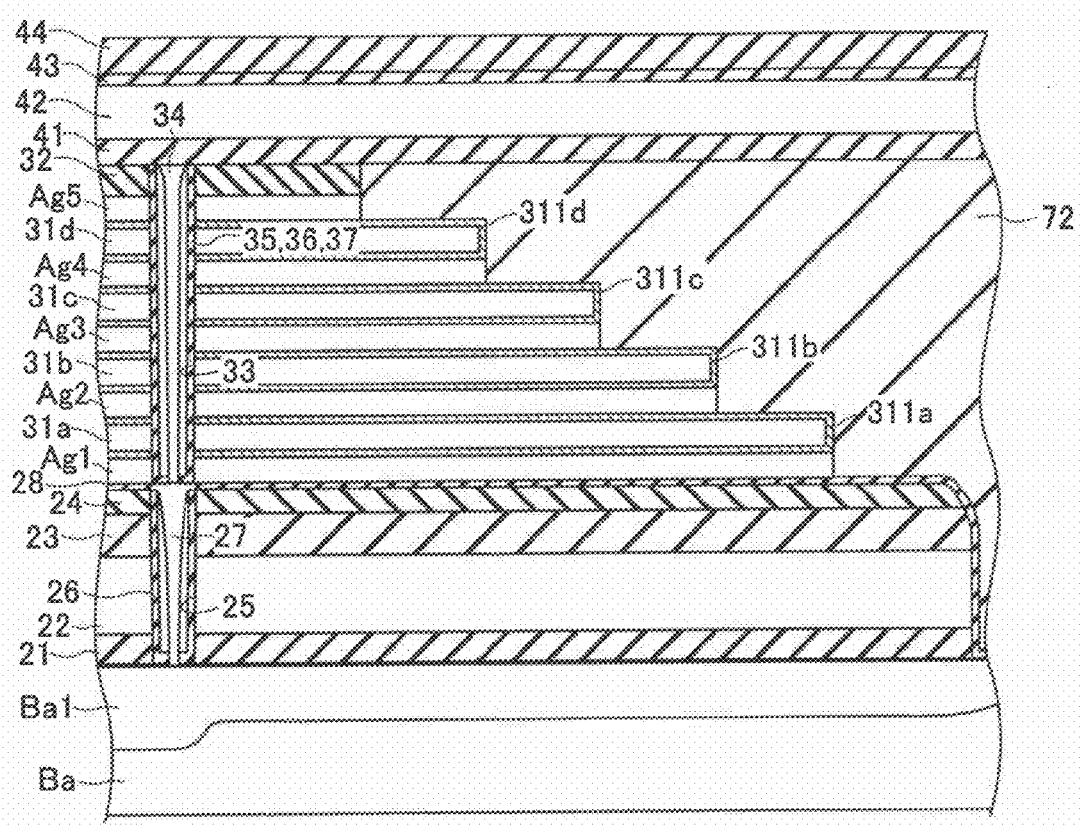
FIG. 21 is a cross-sectional view of the non-volatile semiconductor storage device 100 in the manufacturing process according to the one embodiment of the present invention.

Then, as illustrated in FIG. 21, a drain-side first insulation layer 41, a drain-side conductive layer 42, a drain-side second insulation layer 43, and a drain-side third insulation layer 44 are sequentially laminated on the memory upper insulation layer 32 and the interlayer insulation layer 72.

Figure 22:
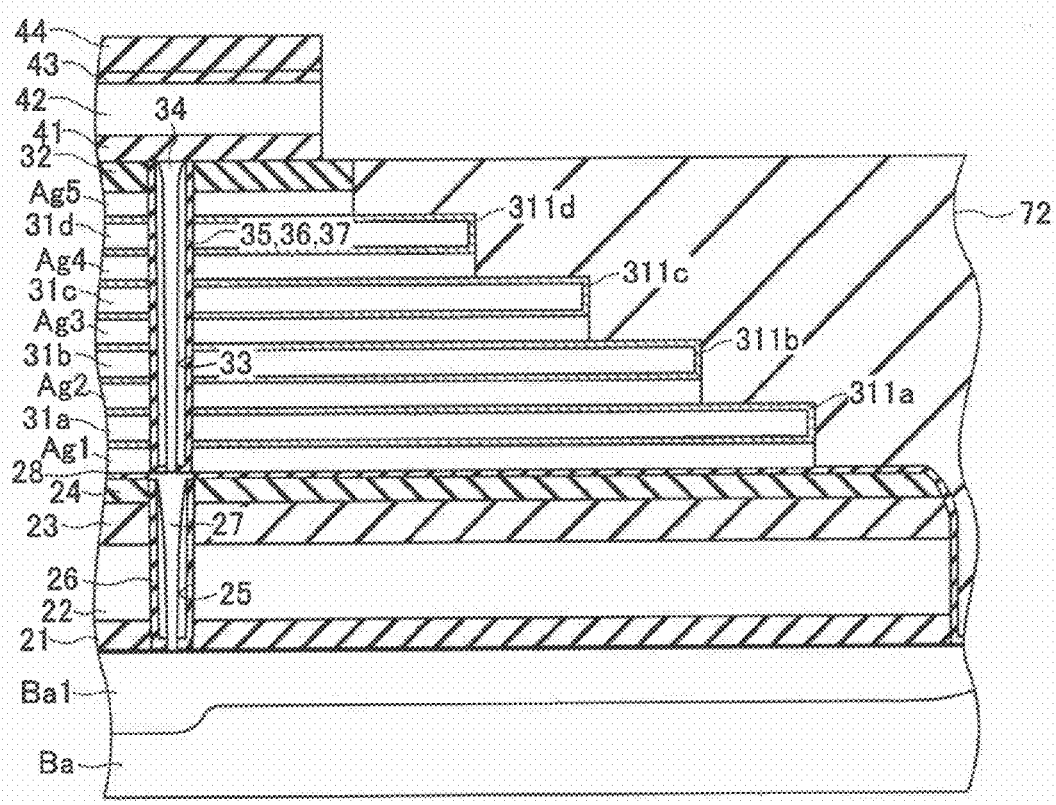
FIG. 22 is a cross-sectional view of the non-volatile semiconductor storage device 100 in the manufacturing process according to the one embodiment of the present invention.

Then, as illustrated in FIG. 22, resists are applied thereto and the drain-side third insulation layer 44, the drain-side second insulation layer 43, the drain-side conductive layer 42, and the drain-side first insulation layer 41 are partially removed. In this removal step, the drain-side first insulation layer 41, the drain-side conductive layer 42, the drain-side second insulation layer 43, and the drain-side third insulation layer 44 are removed in such a way that the respective row-direction ends should not protrude farther in the row direction than the end of the memory upper insulation layer 32.

In addition, in the step of FIG. 22, those portions of the drain-side third insulation layer 44, the drain-side second insulation layer 43, the drain-side conductive layer 42, and the drain-side first insulation layer 41 are removed that are located in the regions where the memory columnar semiconductor 34 is not formed in the row direction. Further, the side surface of the drain-side conductive layer 42, parallel to the row direction, is silicided to form a silicide film 421 (not illustrated).

Figure 23:
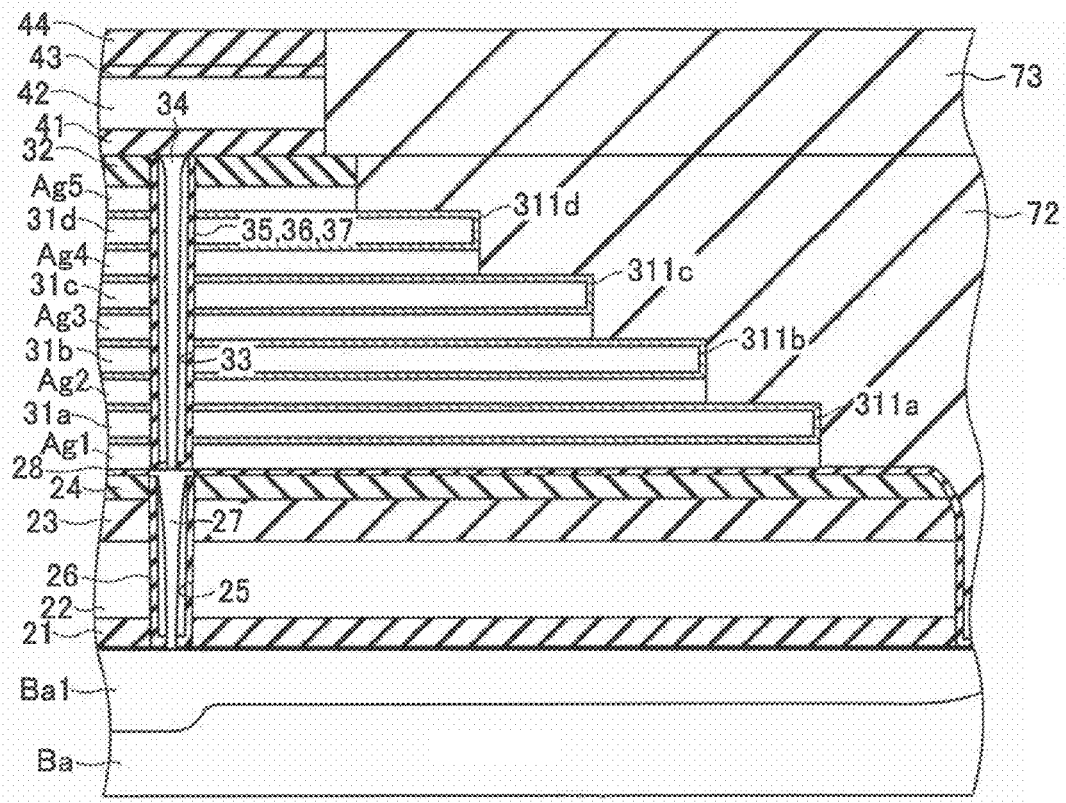
FIG. 23 is a cross-sectional view of the non-volatile semiconductor storage device 100 in the manufacturing process according to the one embodiment of the present invention.

Then, as illustrated in FIG. 23, an interlayer insulation layer 73 is further deposited on the interlayer insulation layer 72, the surface of which is then flattened by CMP to be parallel to the top surface of the drain-side third insulation layer 44.

Figure 24:
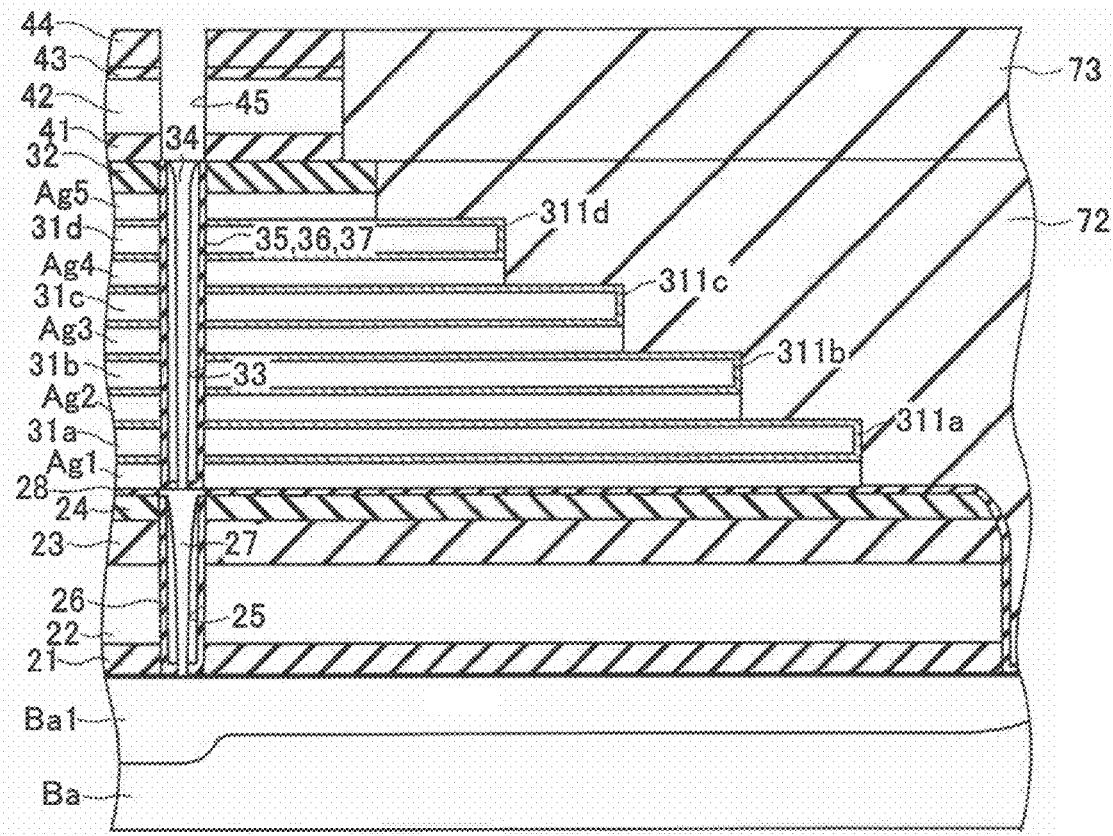
FIG. 24 is a cross-sectional view of the non-volatile semiconductor storage device 100 in the manufacturing process according to the one embodiment of the present invention.

Then, as illustrated in FIG. 24, a drain-side hole 45 is formed to penetrate those portions of the drain-side third insulation layer 44, the drain-side second insulation layer 43, the drain-side conductive layer 42, and the drain-side first insulation layer 41 that are located on the upper portion of the memory columnar semiconductor 34.

Figure 25:
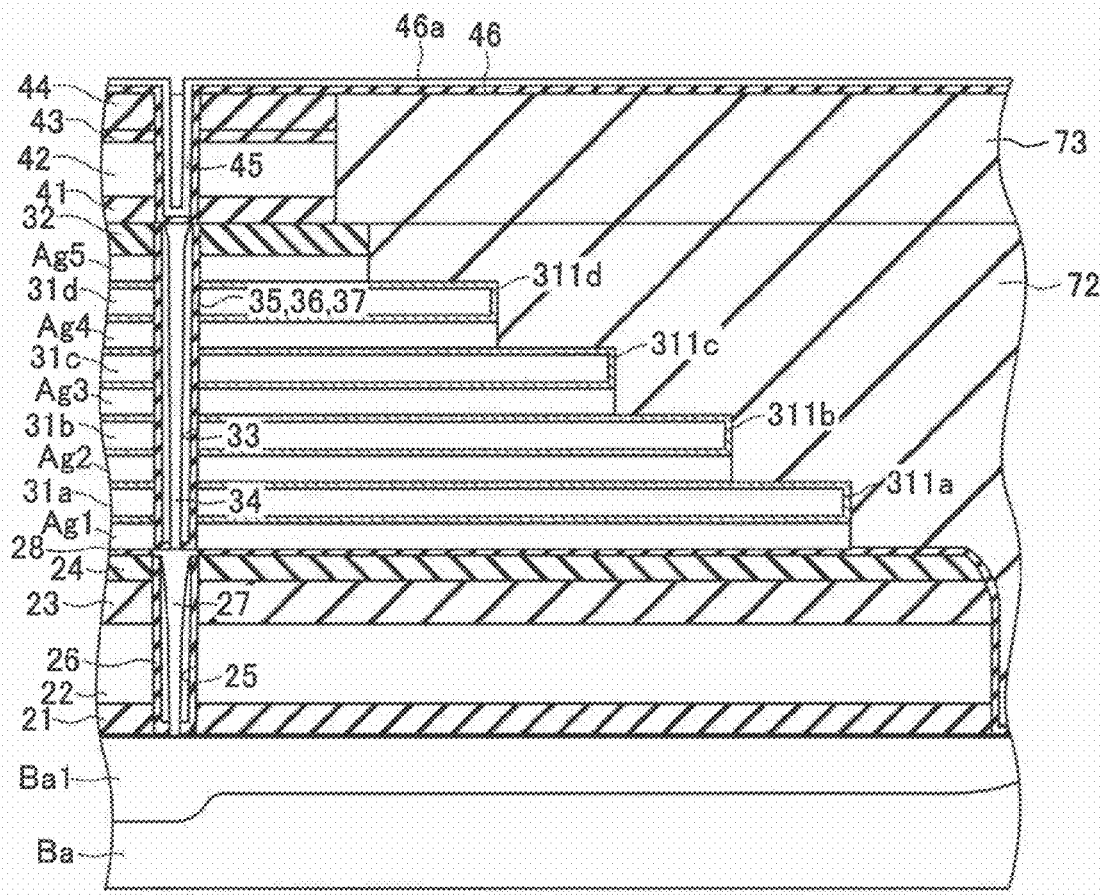
FIG. 25 is a cross-sectional view of the non-volatile semiconductor storage device 100 in the manufacturing process according to the one embodiment of the present invention.

Then, a drain-side gate insulation layer 46 and an amorphous silicon layer 46a are sequentially laminated as illustrated in FIG. 25.

Figure 26:
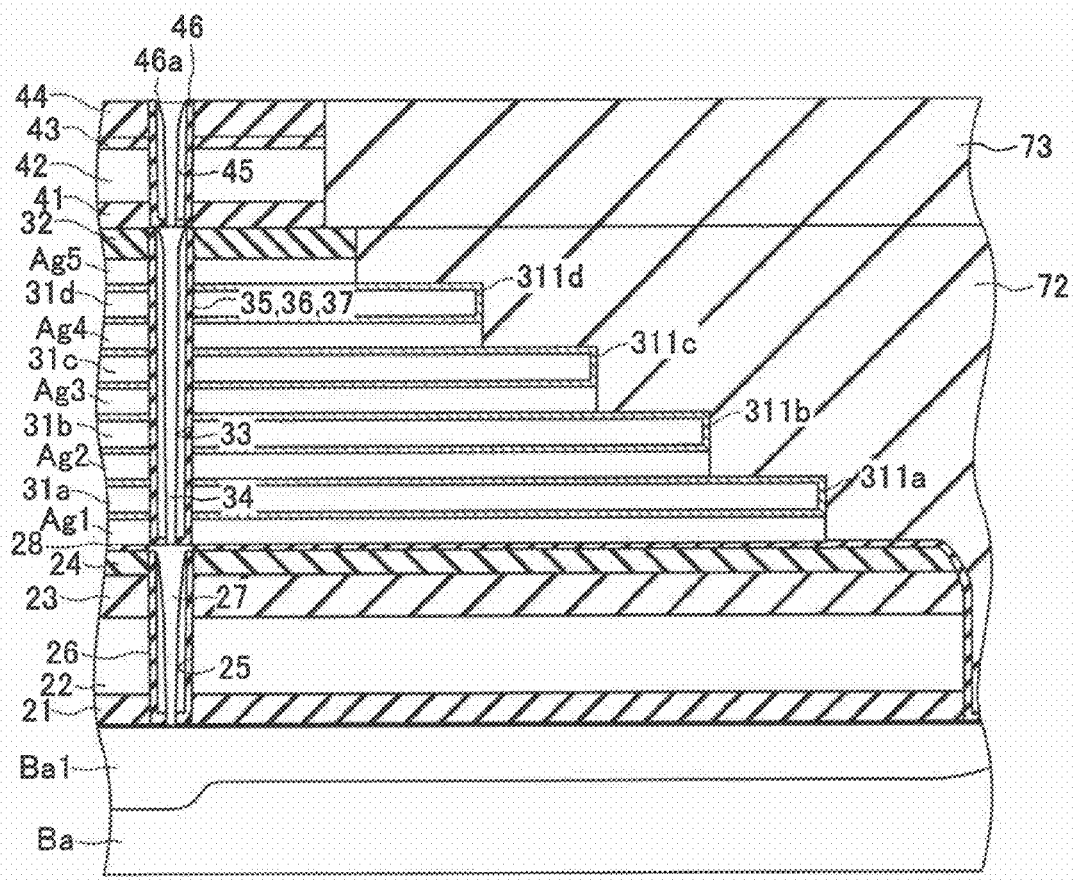
FIG. 26 is a cross-sectional view of the non-volatile semiconductor storage device 100 in the manufacturing process according to the one embodiment of the present invention.

Then, as illustrated in FIG. 26, those portions of the drain-side gate insulation layer 46 and the amorphous silicon layer 46a are removed that are located on the bottom surface of the drain-side hole 45, on the top surface of the drain-side third insulation layer 44, and on the top surface of the interlayer insulation layer 73, respectively. That is, the drain-side gate insulation layer 46 and the amorphous silicon layer 46a are processed to be left only on the sidewall of the drain-side hole 45.

Figure 27:
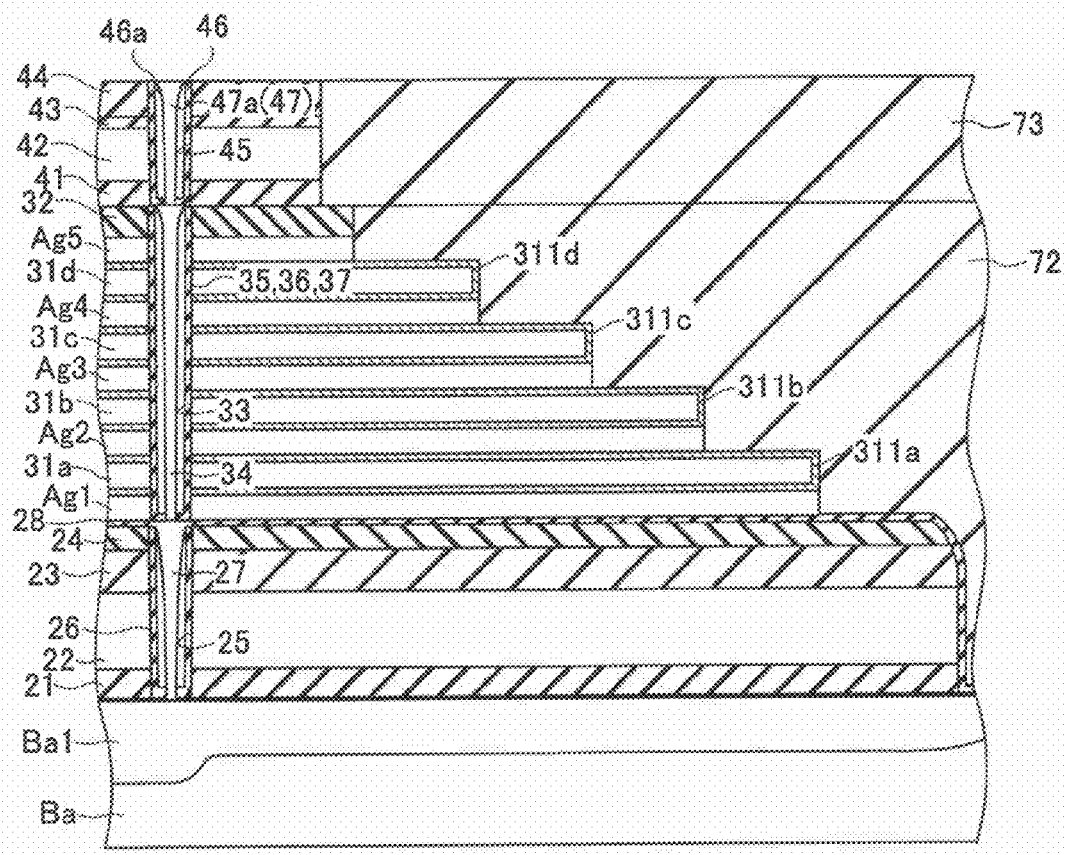
FIG. 27 is a cross-sectional view of the non-volatile semiconductor storage device 100 in the manufacturing process according to the one embodiment of the present invention.

Then, an amorphous silicon layer 47a is deposited in the drain-side hole 45, the surface of which is then flattened by CMP. The amorphous silicon layer 47a and the amorphous silicon layer 46a become a drain-side columnar semiconductor layer 47. Then, phosphorus ion (P) is implanted into the drain-side columnar semiconductor layer 47. The resulting state of this process is depicted in FIG. 27.

Figure 28:
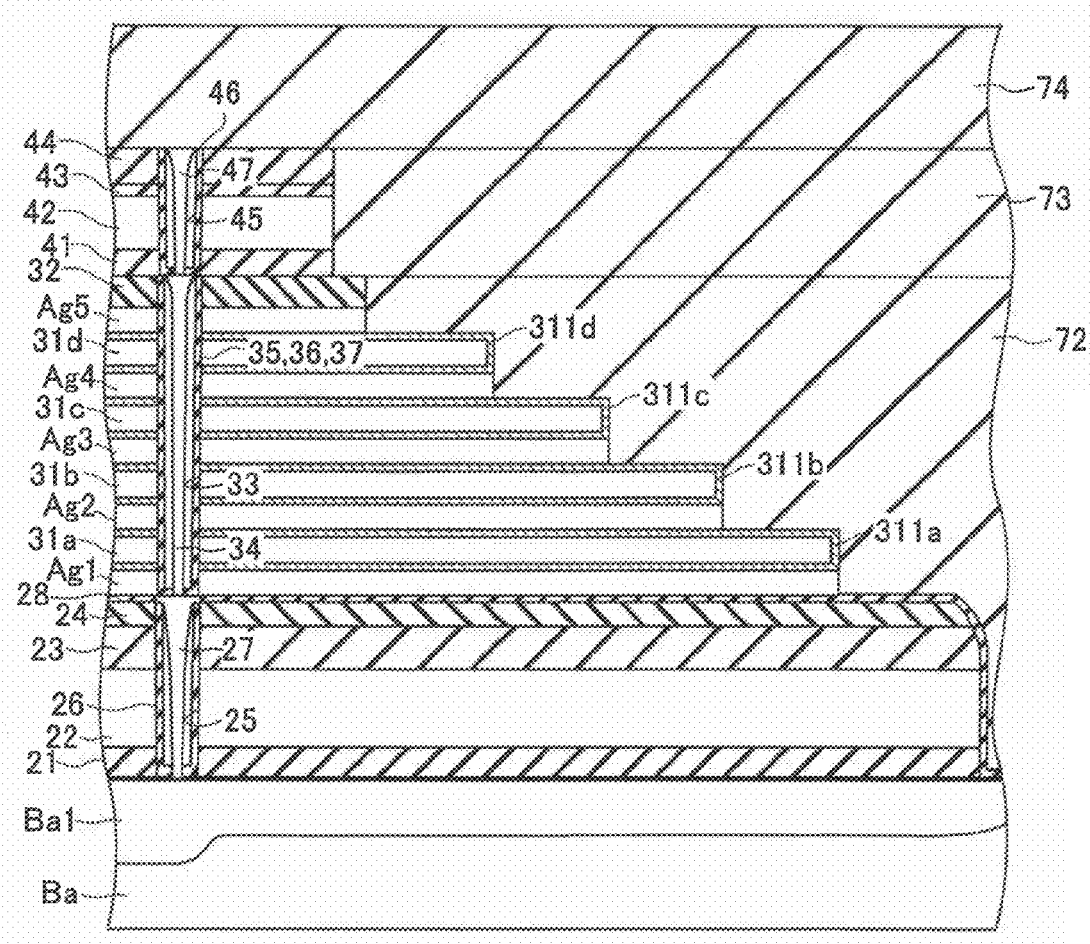
FIG. 28 is a cross-sectional view of the non-volatile semiconductor storage device 100 in the manufacturing process according to the one embodiment of the present invention.
Figure 29:
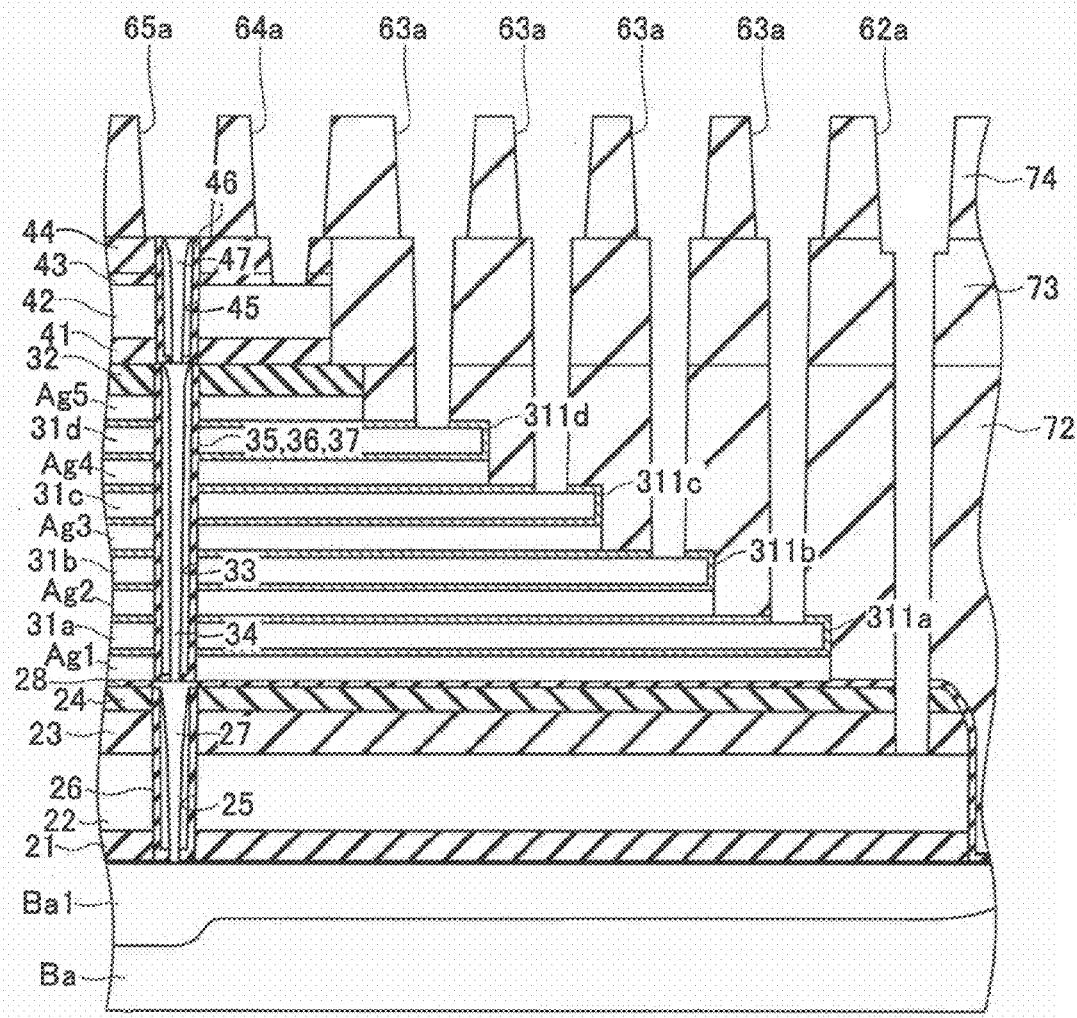
FIG. 29 is a cross-sectional view of the non-volatile semiconductor storage device 100 in the manufacturing process according to the one embodiment of the present invention.

Then, an interlayer insulation layer 74 is deposited thereon as illustrated in FIG. 28. Then, a source-line contact hole (not illustrated) is formed, ranging from the surface of the interlayer insulation layer 74 to a P-well diffusion layer Ba1, so as to penetrate the respective layers (labeled 74, 73, 72, 28). In addition, a source-side selection gate contact hole 62a is formed, ranging from the surface of the interlayer insulation layer 74 to the source-side conductive layer 22, so as to penetrate the respective layers (labeled 74, 73, 72, 28, 24, 23). In addition, control gate contact holes 63a are formed, ranging from the surface of the interlayer insulation layer 74 to the first to fourth word-line conductive layers 31a to 31d, so as to penetrate the respective layers (labeled 74, 73, 72). In addition, a drain-side selection gate contact hole 64a is formed, ranging from the surface of the interlayer insulation layer 74 to the drain-side conductive layer 42, so as to penetrate the respective layers (labeled 74, 44, 43). In addition, a bit-line hole 65a is formed, ranging from the surface of the interlayer insulation layer 74 to the drain-side columnar semiconductor layer 47, so as to penetrate the interlayer insulation layer 74. The resulting state of this process is depicted in FIG. 29.

Figure 30:
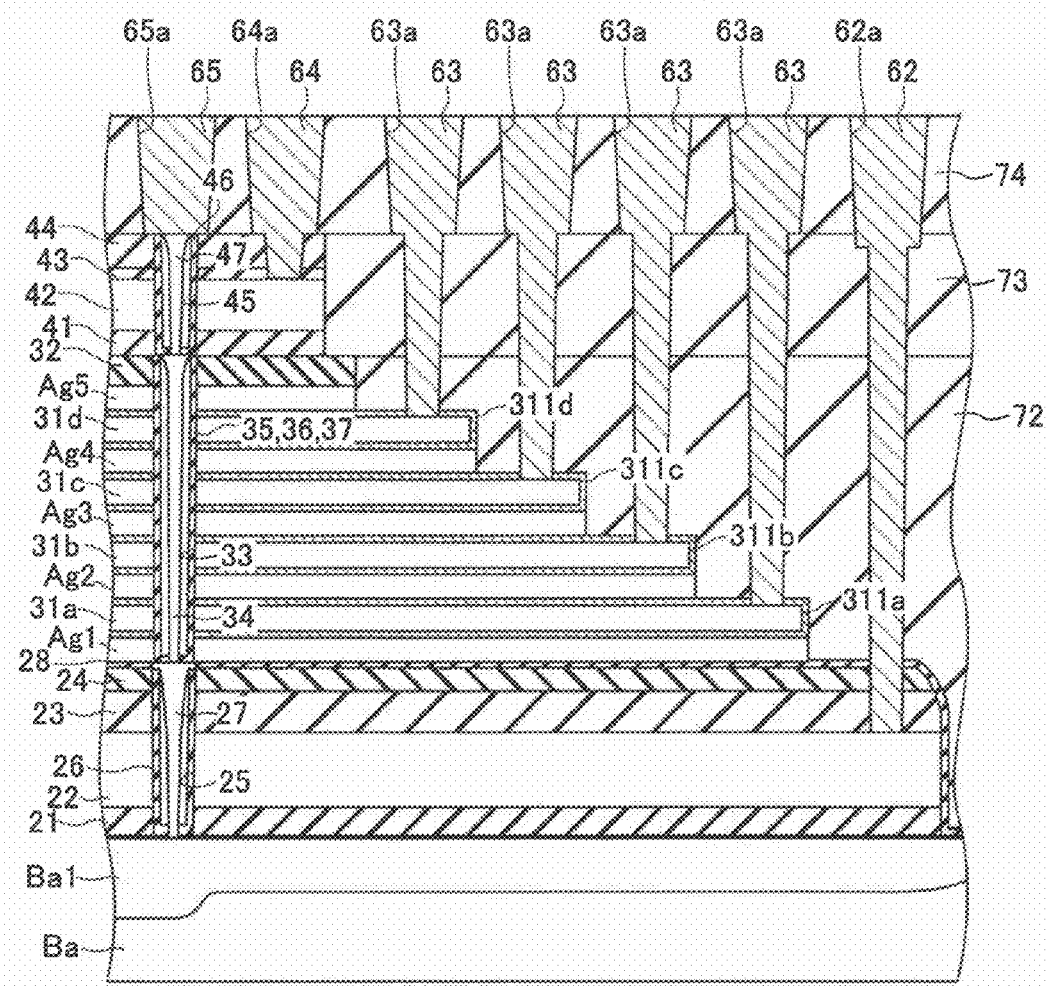
FIG. 30 is a cross-sectional view of the non-volatile semiconductor storage device 100 in the manufacturing process according to the one embodiment of the present invention.

Then, metal films are deposited in the source-line contact hole, the source-side selection gate contact hole 62a, the control gate contact holes 63a, the drain-side selection gate contact hole 64a, and the bit-line hole 65a, the surface of which is then flattened by CMP. Through this process, as illustrated in FIG. 30, a source line contact layer 61, a source-side selection gate contact layer 62, control gate contact layers 63, a drain-side selection gate contact layer 64, and a bit-line layer 65 are formed in the source-line contact hole, the source-side selection gate contact hole 62a, the control gate contact holes 63a, the drain-side selection gate contact hole 64a, and the bit-line hole 65a.

(Advantages of Non-Volatile Semiconductor Storage Device 100 in One Embodiment)

Advantages of the non-volatile semiconductor storage device 100 according to the one embodiment will now be described below. As can be seen from the above lamination structure, the non-volatile semiconductor storage device 100 according to the one embodiment may achieve high integration. In addition, as described in the above manufacturing process of the non-volatile semiconductor storage device 100, each layer corresponding to respective memory transistors MTrmn, source-side selection transistors SSTrmn, and drain-side selection transistors SDTrmn may be manufactured in a predetermined number of lithography steps, irrespective of the number of laminated layers. That is, the non-volatile semiconductor storage device 100 may be manufactured at a lower cost.

Further, in the non-volatile semiconductor storage device 100 according to the one embodiment, the first to fourth word-line conductive layers 31a to 31d are formed with air gaps Ag1 to Ag4 provided therebetween. Thus, the permittivity is determined by the fluid sealed in the air gaps Ag1 to Ag4. For example, if the air gaps Ag1 to Ag4 are filled with air, then the permittivity is 1. That is, the air gaps Ag1 to Ag4 may reduce capacitive coupling between the first to fourth word-line conductive layers 31a to 31d (between the control gate electrodes of the corresponding memory transistors MTrnm).

Further, the first to fourth word-line conductive layers 31a to 31d have silicide films 311a to 311d provided on their surfaces. The silicide films 311a to 311d may reduce resistance in the first to fourth word-line conductive layers 31a to 31d (the control gate electrodes of the corresponding memory transistors MTrnm).

Thus, the time difference can be reduced for boosting voltage between one ends of the first to fourth word-line conductive layers 31a to 31d to which voltage is applied from the control gate contact layers 63 and the other ends spaced by a predetermined distance from the one ends. That is, the delay in operation of the non-volatile semiconductor storage device 100 can be suppressed.

In addition, silicide films 421 are formed on the side surface of the drain-side conductive layer 42, parallel to the row direction. The silicide films 421 may reduce resistance in the drain-side conductive layer 42 (the drain-side selection transistors SDTrnm).

In addition, according to the above-mentioned manufacturing method, the sacrifice layers 71 are composed of such material that has a lower etching selectivity than the first to fourth word-line conductive layers 31a to 31d, which allows the memory holes 33 to be easily formed in the first to fourth word-line conductive layers 31a to 31d.

While one embodiment of the non-volatile semiconductor storage device has been described, the present invention is not intended to be limited to the disclosed embodiment and various other changes, additions, replacements or the like may be made thereto without departing from the spirit of the invention.

What is claimed is:

1. A method of manufacturing a non-volatile semiconductor storage device having a plurality of memory strings with a plurality of electrically rewritable memory cells connected in series; the method comprising:
    alternately laminating a plurality of sacrifice layers and a plurality of first conductive layers;
    forming a first hole so as to penetrate the sacrifice layers and the first conductive layers;
    sequentially forming a first insulation layer, a charge accumulation layer, a second insulation layer, and a first columnar semiconductor layer on the surface of the first hole; and
    removing the sacrifice layers to form air gaps between the first conductive layers located there above and there below.

2. The method of manufacturing the non-volatile semiconductor storage device according to claim 1, wherein
    the sacrifice layers are composed of such material that can be processed by etching gas for use in silicon processing.

3. The method of manufacturing the non-volatile semiconductor storage device according to claim 1, wherein
    the sacrifice layers are composed of silicon germanium or silicon nitride.

4. The method of manufacturing the non-volatile semiconductor storage device according to claim 1, further comprising:
    providing an insulative fluid with lower permittivity than silicon oxide, or a solid insulation layer with lower permittivity than silicon oxide in air gaps that are formed by removing the sacrifice layers.

5. The method of manufacturing the non-volatile semiconductor storage device according to claim 1, wherein
    the surfaces of the first conductive layers are silicided.

6. The method of manufacturing the non-volatile semiconductor storage device according to claim 4, wherein
    the surfaces of the first conductive layers are silicided.

7. The method of manufacturing the non-volatile semiconductor storage device according to claim 1, further comprising:
    prior to laminating the sacrifice layers and the first conductive layers, depositing a second conductive layer;
    forming a second hole so as to penetrate the second conductive layer; and
    sequentially forming a third insulation layer and a second columnar semiconductor layer on the surface of the second hole.

8. The method of manufacturing the non-volatile semiconductor storage device according to claim 1, further comprising:
    after removing the sacrifice layers, depositing a second conductive layer;
    forming a second hole so as to penetrate the second conductive layer; and
    sequentially forming a third insulation layer and a second columnar semiconductor layer on the surface of the second hole.

9. The method of manufacturing the non-volatile semiconductor storage device according to claim 1, wherein
    the first conductive layers and the first columnar semiconductor layer are composed of polysilicon,
    the first insulation layer is composed of silicon oxide,
    the second insulation layer is composed of aluminum oxide, and
    the charge accumulation layer is composed of silicon nitride.

10. The method of manufacturing the non-volatile semiconductor storage device according to claim 7, wherein
    the second conductive layer and the second columnar semiconductor layer are composed of polysilicon, and
    the third insulation layer is composed of silicon oxide.

11. The method of manufacturing the non-volatile semiconductor storage device according to claim 8, wherein
    the second conductive layer and the second columnar semiconductor layer are composed of polysilicon, and
    the third insulation layer is composed of silicon oxide.

* * * * *